US008803197B2

(12) United States Patent
Fukuhara

(10) Patent No.: US 8,803,197 B2
(45) Date of Patent: Aug. 12, 2014

(54) SEMICONDUCTOR WAFER, INSULATED GATE FIELD EFFECT TRANSISTOR, AND METHOD FOR PRODUCING SEMICONDUCTOR WAFER

(71) Applicant: Sumitomo Chemical Company, Limited, Tokyo (JP)

(72) Inventor: Noboru Fukuhara, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/777,543

(22) Filed: Feb. 26, 2013

(65) Prior Publication Data
US 2013/0168738 A1 Jul. 4, 2013

Related U.S. Application Data

(63) Continuation-in-part of application No. PCT/JP2011/004845, filed on Aug. 30, 2011.

(30) Foreign Application Priority Data

Aug. 31, 2010 (JP) ................. 2010-195176

(51) Int. Cl.
*H01L 31/0328* (2006.01)
*H01L 31/0336* (2006.01)
*H01L 31/072* (2012.01)
*H01L 31/109* (2006.01)

(52) U.S. Cl.
USPC ............ 257/192; 257/194; 257/E29.246

(58) Field of Classification Search
CPC ............ H01L 29/66431; H01L 29/66462; H01L 29/778
USPC .......... 257/192, 194, 615, E29.246, E29.247; 438/167, 172, 478
See application file for complete search history.

(56) References Cited

U.S. PATENT DOCUMENTS 6,359,294 B1 3/2002 Passlack et al.
8,507,950 B2 * 8/2013 Hada et al. .................. 257/194
(Continued)

FOREIGN PATENT DOCUMENTS

JP 10-275806 A 10/1998
JP 2002-324813 A 11/2002
(Continued)

OTHER PUBLICATIONS

International Preliminary Report on Patentability and Written Opinion mailed Mar. 21, 2013 in International Application No. PCT/JP2011/004845 to Sumitomo Chemical Co., Ltd.
(Continued)

*Primary Examiner* — Hoai V Pham
(74) *Attorney, Agent, or Firm* — Sughrue Mion, PLLC

(57) ABSTRACT

Provided is a semiconductor wafer including a base wafer, a first crystalline layer, a second crystalline layer, and an insulating layer that are positioned in the stated order, the semiconductor wafer further including: a third crystalline layer positioned either between the first crystalline layer and the second crystalline layer or between the base wafer and the first crystalline layer. The second crystalline layer and the third crystalline layer are made of a crystal that either lattice matches or pseudo lattice matches a crystal making the first crystalline layer, and has a wider band gap than the crystal making the first crystalline layer. The third crystalline layer includes a first atom that will be a donor or an acceptor. When the third crystalline layer includes a first atom that will be a donor, the second crystalline layer includes a second atom that will be an acceptor.

22 Claims, 22 Drawing Sheets

(56) References Cited

U.S. PATENT DOCUMENTS

| | | |
|---|---|---|
| 2004/0137673 A1 | 7/2004 | Passlack et al. |
| 2006/0054929 A1 | 3/2006 | Nakayama et al. |
| 2006/0192228 A1 | 8/2006 | Nakano et al. |
| 2008/0283870 A1 | 11/2008 | Sato |
| 2009/0166642 A1 | 7/2009 | Nakano |
| 2010/0044753 A1 | 2/2010 | Sugimoto et al. |

FOREIGN PATENT DOCUMENTS

| | | |
|---|---|---|
| JP | 2004-207471 A | 7/2004 |
| JP | 2004-207473 A | 7/2004 |
| JP | 2004-273486 A | 9/2004 |
| JP | 4041075 B2 | 1/2008 |
| JP | 2009-004743 A | 1/2009 |
| JP | 2010-050280 A | 3/2010 |
| WO | 03/103037 A1 | 12/2003 |
| WO | 2004/073070 A1 | 8/2004 |
| WO | 2007/139218 A1 | 12/2007 |

OTHER PUBLICATIONS

J. Ayubi-Moak, et al., "Effect of interface state trap density on the characteristics of η-type, enhancement-mode, implant-free $In_{0.3}Ga_{0.7}As$ MOSFETs", Microelectronic Engineering, vol. 86, 2009, pp. 1564-1567.

Matthias Passlak, et al., "High mobility NMOSFET Structure With High-κ Dielectric", IEEE Electron Device Letters, vol. 26, No. 10, Oct. 2005, pp. 713-715.

* cited by examiner

SEMICONDUCTOR WAFER, INSULATED GATE FIELD EFFECT TRANSISTOR, AND METHOD FOR PRODUCING SEMICONDUCTOR WAFER

TECHNICAL FIELD

The present invention relates to a semiconductor wafer, an insulated gate field effect transistor, and a method for producing a semiconductor wafer.

The contents of the following Japanese patent application and PCT patent application are incorporated herein by reference:
No. JP2010-195176 filed on Aug. 31, 2010, and
No. PCT/JP2011/004845 filed on Aug. 30, 2011.

BACKGROUND ART

Pseudomorphic high electron mobility transistors (P-HEMT) have been conceived of as a structure to further enhance the electron mobility and the electron concentration of the HEMTs. Several types of P-HEMTs that have a Schottky gate structure or a pn junction gate structure have already started to be used for the high frequency communication elements, taking advantage of their high electron mobility characteristics.

Patent Document 1 and Patent Document 2 disclose an epitaxial wafer for P-HEMT. The disclosed epitaxial wafer utilizes an InGaAs layer as a strained channel layer, and an AlGaAs layer as an electron supply layer at the front and at the back. Patent Document 3 discloses an interface structure of the insulator-compound semiconductor. The interface structure includes a compound semiconductor, a spacer layer disposed on the surface of the compound semiconductor, and an insulating layer disposed on the spacer layer, and Patent Document 3 discloses that the spacer layer is a semiconductor substance having a band gap larger than the band gap of the compound semiconductor.

Patent Document 4 discloses a GaN hetero structure field effect transistor that includes a channel layer 2, an n-type barrier layer 4, a p-type base layer 6, a gate electrode 16, a source electrode 12, and a drain electrode 14. The channel layer 2 is formed by an i-GaN layer, and can be expressed by the composition formula $Al_xGa_{1-x}N$ ($0 \leq x \leq 1$), for example. The n-type barrier layer 4 is for example represented by $Al_yGa_{1-y}N$ ($0 \leq y \leq 1$, $x<y$), for example, and supplies an electron to a channel by being formed by means of an n-AlGaN layer on the channel layer 2. The p-type base layer 6 is selectively formed by means of the p-GaN layer on the barrier layer 4, and is expressed by the composition formula $Al_xGa_{1-x}N$ ($0 \leq x \leq 1$), for example. Patent Document 5 discloses a heterojunction field effect transistor made of a semiconductor including a nitride formed on the wafer 1, which includes a channel layer 3 disposed on the wafer 1, a barrier layer 8 disposed on and above the channel layer 3, and a gate electrode 5 disposed on the barrier layer 8. In this heterojunction field effect transistor, a p-type semiconductor layer 7 is disposed in at least a part of the area between the gate electrode 5 and the channel layer 3 which is below the gate electrode, the p-type semiconductor layer 7 being a semiconductor including an acceptor atom.

Patent Document 1: JP2004-207471 A
Patent Document 2: JP2004-207473 A
Patent Document 3: JPH10-275806 A
Patent Document 4: Japanese Patent 4041075
Patent Document 5: JP2004-273486 A

SUMMARY OF THE INVENTION

Problems to be Solved by the Invention

The P-HEMT structure disclosed in Patent Document 1 or Patent Document 2 can realize a high electron mobility and a high two-dimensional electron gas concentration. So as to realize a more favorable transistor performance such as in terms of gate breakdown voltage, it is desirable to realize the MIS (metal-insulator-semiconductor)-type gate structure, for example as disclosed in Patent Document 3.

However, if the MIS-type gate structure is adopted, formation of interface states is inevitable. What is worse, the density of the interface states in the interface between the insulator and the semiconductor is difficult to be decreased, unlike the interface states in the interface between the semiconductor and the semiconductor (i.e., hetero interface). The interface states will degrade the electric-field controllability of the carriers in channels, and have a possibility of lowering the operational speed due to charging and discharging. It also has a possibility of being a cause for carrier extinction made by interface recombination or the like. Furthermore, the interface states may cause the transistor performance deterioration such as degrading of the carrier mobility. An object of the present invention is to provide an insulated gate type (MIS-type) P-HEMT structure that can realize a favorable transistor performance in that it can improve the carrier mobility of the channel layer and that is not vulnerable to the effect of the interface states.

Means for Solving the Problems

In view of the above discussions, according to the first aspect related to the present invention, provided is a semiconductor wafer including: a base wafer, a first crystalline layer, a second crystalline layer, and an insulating layer that are positioned in the stated order, the semiconductor wafer further including: a third crystalline layer positioned either between the first crystalline layer and the second crystalline layer or between the base wafer and the first crystalline layer, where the second crystalline layer is made of a crystal that either lattice matches or pseudo lattice matches a crystal making the first crystalline layer, and has a wider band gap than the crystal making the first crystalline layer, the third crystalline layer is made of a crystal that either lattice matches or pseudo lattice matches the crystal making the first crystalline layer, and has a wider band gap than the crystal making the first crystalline layer, the third crystalline layer includes a first atom that will be a donor or an acceptor, and when the third crystalline layer includes a first atom that will be a donor, the second crystalline layer includes a second atom that will be an acceptor, and when the third crystalline layer includes a first atom that will be an acceptor, the second crystalline layer includes a second atom that will be a donor.

The first crystalline layer can be applied to a channel layer of a field effect transistor, and the insulating layer can be applied to a gate insulating layer of the field effect transistor. When the field effect transistor is of an N-channel-type, the first atom of the third crystalline layer will be a donor, and when the field effect transistor is a P-channel-type, the first atom of the third crystalline layer will be an acceptor.

The mentioned semiconductor wafer may further include a fourth crystalline layer. In such a case, when the third crystalline layer is disposed between the first crystalline layer and the second crystalline layer, the fourth crystalline layer is disposed between the base wafer and the first crystalline layer, when the third crystalline layer is disposed between the base wafer and the first crystalline layer, the fourth crystalline layer is disposed between the first crystalline layer and the second crystalline layer. The fourth crystalline layer may be made of a crystal that either lattice matches or pseudo lattice matches the crystal making the first crystalline layer, and has a wider band gap than the crystal making the first crystalline layer, and may include the first atom.

The sheet concentration $N_1$ of the first atom and the sheet concentration $N_2$ of the second atom may preferably satisfy the relation of Expression 1.

$$N_{0min} + SF_{min} \times N_2 < N_1 < N_{0max} + SF_{max} \times N_2 \quad \text{EXPRESSION 1}$$

In the above expression, $N_{0min}$ and $N_{0max}$ are respectively the minimum value and the maximum value of the sheet concentration $N_0$ of the first atom where the threshold voltage of the field effect transistor becomes a design value when no second atom is doped into the second crystalline layer (the unit adopted is [atoms/cm$^{-2}$], hereinafter occasionally referred to as [cm$^{-2}$] in the unit notation), and $SF_{min}$ and $SF_{max}$ are respectively the minimum value and the maximum value or the structural factor SF (no unit) showing the layer structure of the field effect transistor.

$N_0$ is given by Expression 5 when the field effect transistor is of an N-channel-type, and when the field effect transistor is of a P-channel-type, $N_0$ is given by Expression 6.

$$N_0 = \frac{W - Cf - Vt}{\left(\frac{d}{\varepsilon}\right)_1 + \left(\frac{d}{\varepsilon}\right)_2 + \left(\frac{d}{\varepsilon}\right)_3} \times \frac{\varepsilon_0}{q} + Const \quad \text{EXPRESSION 5}$$

$$-N_0 = \frac{W - Cf - Vt}{\left(\frac{d}{\varepsilon}\right)_1 + \left(\frac{d}{\varepsilon}\right)_2 + \left(\frac{d}{\varepsilon}\right)_3} \times \frac{\varepsilon_0}{q} - Const \quad \text{EXPRESSION 6}$$

Note that W[V] is the work function of the gate electrode of the field effect transistor, and Vt[V] represents the threshold voltage of the field effect transistor. Cf[V] is a corrected value of the channel material's physical property, which concretely corresponds to the difference between the Fermi level and the vacuum level at the channel position when the gate voltage of the field effect transistor is Vt. When the field effect transistor is of an N-channel-type, Cf substantially matches the electron affinity. When the channel of the field effect transistor is a quantum well, Cf substantially matches the potential from the ground level to the vacuum level. When the field effect transistor is or a P-channel-type, Cf will be a potential difference substantially equaling the ionized potential. Cf will differ as the composition of the crystalline layer changes.

$(d/\varepsilon)_1$ shows an electric film thickness [cm] of the insulating layer, $(d/\varepsilon)_2$ shows an electric film thickness [cm] between the interface of the insulating layer that is near the second crystalline layer and a doping center position of the second atom in the second crystalline layer, and $(d/\varepsilon)_3$ is an electric film thickness [cm] between the doping center position of the second atom in the second crystalline layer and a center position of the first crystalline layer. The electric film thickness is a value obtained by dividing the actual film thickness d [cm] of the layer by a relative permittivity $\varepsilon$ [no unit]. When a plurality of layers whose relative permittivity is different from each other are stacked, a total thickness of electric films can be calculated as $\Sigma (d_i/\varepsilon_i)$ which is the summation of the electric film thickness of each layers (i.e., the value $d_i/\varepsilon_i$ obtained by dividing the film thickness $d_i$ of each layer by the relative permittivity $\varepsilon_i$). "the doping center position of the second atom of the second crystalline layer" is the depth position that provides the weight center of the density distribution in the depth direction of the second atom in the second crystalline layer. For example, when the second atoms are evenly distributed throughout the second crystalline layer, "the doping center position" corresponds to the position at ½ times the film thickness of the thickness of the second crystalline layer. "the center position of the first crystalline layer" corresponds to the position at ½ times the film thickness of the thickness direction of the first crystalline layer.

$\varepsilon_0$ is a vacuum dielectric constant [F/cm], and the q represents an elementary charge [C]. Const[atoms/cm$^2$], although being a constant, depends on the various design conditions of the crystalline layers. Specifically, it corresponds to $N_1$ at which the threshold voltage Vt becomes W—Cf when there is no second atom doped. Normally, a buffer layer is formed between the channel layer and the base wafer. An electric field is formed near the channel side of the buffer layer to confine the carriers in the channel. Const corresponds to the sheet concentration of the first atom that cancels out this electric field. As detailed later, the normal range would be $2.3 \times 10^{11}$ to $1.4 \times 10^{12}$ [atoms/cm$^2$] for ordinary compound semiconductors. In other words, $N_0$ can vary within the range in which Const can vary, and $N_{0min}$ corresponds to $N_0$ at which Const is the lower edge, and $N_{0max}$ corresponds to $N_0$ at which Const is the higher edge. Note that when the buffer layer has been adequately designed, $N_0$ can be an experimentally determined value. In such a case, the sheet concentration $N_{0exp}$ of the first atom experimentally obtained can be $N_{0exp} = N_0 = N_{0min} = N_{0max}$.

An example of SF is Expression 7.

$$SF = \frac{\left(\frac{d}{\varepsilon}\right)_1 + \left(\frac{d}{\varepsilon}\right)_2}{\left(\frac{d}{\varepsilon}\right)_1 + \left(\frac{d}{\varepsilon}\right)_2 + \left(\frac{d}{\varepsilon}\right)_3} \quad \text{EXPRESSION 7}$$

When the threshold value Vt for the field effect transistor is fixed at a constant value, the sheet concentration $N_1$ of the first atom is increased in accordance with the sheet concentration $N_2$ of the second atom. SF is a factor approximating the ratio of the amount of increase of the sheet concentration $N_1$ of the first atom with respect to the amount of increase of sheet concentration $N_2$ of the second atom($dN_1/dN_2$). Since it is the approximation expression of the ratio $dN_1/dN_2$, the $dN_1/dN_2$ ratio can be approximated within a certain tolerance range. For example, the approximated value corresponds to the $dN_1/dN_2$ ratio with the tolerance range of SF±10% In other words, $SF_{min} = SF \times 0.9$, $SF_{max} = SF \times 1.1$. For $(d/\varepsilon)_1$, $(d/\varepsilon)_2$, $(d/\varepsilon)_3$, please refer to the above explanation.

The sheet concentration $N_2$ of the second atom included in the second crystalline layer should preferably satisfy Expression 2:

$$N_2 > 1 \times 10^{12} \text{ (cm}^{-2}) \quad \text{EXPRESSION 2}$$

Or, when the effective electric film thickness is $(d/\varepsilon)_E$ as defined by Expression 3, the relation of Expression 4

$$N_2 \times (d/\varepsilon)_E > 1 \times 10^5 \text{ (cm}^{-1}) \quad \text{EXPRESSION 4}$$

should preferably be satisfied. $(d/\in)_E$ is defined as Expression 3.

$$\left(\frac{d}{\varepsilon}\right)_E = \frac{\left(\frac{d}{\varepsilon}\right)_1 \times \left(\frac{d}{\varepsilon}\right)_3}{\left(\frac{d}{\varepsilon}\right)_1 + \left(\frac{d}{\varepsilon}\right)_2 + \left(\frac{d}{\varepsilon}\right)_3} \quad \text{EXPRESSION 3}$$

For $(d/\in)_1$, $(d/\in)_2$, $(d/\in)_3$, please refer to the above explanation.

Note that the upper limit of the sheet concentration $N_2$ of the second atom is obtained from the following deliberation. When the second crystalline layer and the insulating layer make up the MOS interface, the shift $\Delta$ [eV] of the Fermi level at the MOS interface can be approximated as $\Delta = q/\in_0 \times (d/\in)_E \times N_2$. Therefore, when the field effect transistor is of an N-channel-type (i.e. the main carrier of conduction is an electron), the potential of the MOS interface will be raised up as you increase the sheet concentration $N_2$ of the acceptor (second atom), and the Fermi level will shift by $\Delta$ [eV] In this case, the potential to the electron will become large, however the potential to the hole decreases. In other words, as $N_2$ increases, the difference between the gate voltage (i.e. threshold voltage) as electron begins to increase and the gate voltage at hole begins to increase will be smaller.

When the threshold voltage is applied to the gate of the transistor, it is preferable that there is no hole generated. In other words, it is desirable that the second crystalline layer be depleted. Specifically, it is preferable if the difference between the upper edge of the valance band of the second crystalline layer and the lower edge of the conduction band of the first crystalline layer is a positive value. For example, when the second crystalline layer is $Al_{0.24}Ga_{0.76}As$, and the first crystalline layer is $In_{0.3}Ga_{0.7}As$, the shift amount of the Fermi level is desirably equal to or less than 1.5 eV, and $(d/\in)_E \times N_2 \leq 8 \times 10^5$ cm$^{-1}$. Furthermore, when the second crystalline layer is GaAs, and the first crystalline layer is $In_{0.4}Ga_{0.6}As$, the difference between the upper edge of the valance band of the second crystalline layer and the conduction band or the first crystalline layer will be further lowered. Preferably, the second crystalline layer may have a large band gap. Usually, the second crystalline layer is made of a material having a larger band gap than the GaAs layer. Therefore, it is further preferable if the shift amount of the Fermi level be equal to or smaller than 1.2 eV. In this case, preferably, $(d/\in)_E \times N_2 \leq 6.65 \times 10^5$ cm$^{-1}$.

The electric field by the pn structure is desirably equal to or lower than the dielectric breakdown field. The size of the total film thickness of the layer having a large band gap sandwiched between the channel layer (first crystalline layer) and the gate insulating layer will be determined by a trade off between the Fermi level shift by the doping of the second atom and the transconductance of the transistor. For the purpose of maintaining the characteristics as the field effect transistor, the total film thickness should be small enough not to degrade the mobility of the carrier. A preferable range is 30 nm or smaller, and a more preferable range is 20 nm. A GaAs layer is said to have a dielectric breakdown field of 0.4 MV/cm, and the dielectric breakdown field of an AlGaAs layer is presumed to be higher than that of a GaAs layer. The applied voltage is calculated as 0.8 V under the condition in which the film thickness is 20 nm and the dielectric breakdown field is 0.4 MV/em. The shift amount of the Fermi level is also desired to be lower than about 0.8 V. In this case, preferably, $(d/\in)_H \times N_2 \leq 4.4 \times 10^5$ cm$^{-1}$.

For example, the first crystalline layer may be made of a crystal represented by $In_xGa_{1-x}As$ ($0 \leq x \leq 1$), and the second crystalline layer may be made of a crystal represented by $In_kAl_mGa_{1-k-m}As_nP_{1-n}$ ($0 \leq k \leq 1$, $0 \leq m \leq 1$, $0 \leq k+m \leq 1$, $0 \leq n \leq 1$). In such a configuration, the base wafer may desirably be either a GaAs or InP wafer.

For example, the first crystalline layer may be made of a crystal represented by $In_xGa_{1-x}As$ ($0 \leq x \leq 1$) that can either lattice matches or pseudo lattice matches GaAs, and the second crystalline layer may be made of a crystal represented by $Al_mGa_{1-m}As$ ($0 \leq m \leq 1$). In another example, the first crystalline layer may be made of a crystal represented by $In_xGa_{1-x}As$ ($0 \leq x \leq 1$) that either lattice matches or pseudo lattice matches GaAs, and the second crystalline layer may be made of a crystal represented by $In_kAl_mGa_{1-k-m}P$ ($0 \leq k \leq 1$, $0 \leq m \leq 1$, $0 \leq k+m \leq 1$). Preferably, when the second crystalline layer is made of a crystal represented by $In_kAl_mGa_{1-k-m}P$ and the field effect transistor is of an N-channel-type, the second crystalline layer is made of a crystal represented by $In_kAl_mGa_{1-k-m}P$ ($0 \leq k \leq 1$, $0 \leq m \leq 1$, $0 \leq k+m \leq 1$) that has a natural superlattice. When the second crystalline layer is made of a crystal represented by $In_kAl_MGa_{1-k-m}P$ or is made of a crystal represented by $In_kAl_mGa_{1-k-m}P$ that has a natural superlattice, it is further desirable if the second crystalline layer is made of a crystal represented by $In_kGa_{1-k}P$ ($0 \leq k \leq 1$). Under these conditions, the base wafer is desirably a GaAs wafer.

Mere, the expression "has a natural superlattice" indicates that a certain crystal plane formed by mixture between an In atom, an Al atom, and a Ga atom has such a state in which planes having a more In concentration than an average mixture ratio and planes having a more Ga or Al concentration than the average mixture ratio alternates. Furthermore, the ordering is referred to be high when the displacement is larger from the average mixture ratio in each plane.

In an example, the first crystalline layer may be made of a crystal represented by $In_yGa_{1-y}N$ ($0 \leq y \leq 1$) that can either lattice matches or pseudo lattice matches GaN, and the second crystalline layer may be made of a crystal represented by $In_pAl_qGa_{1-p-q}N$ ($0 \leq p \leq 1$, $0 \leq q \leq 1$, $0 \leq p+q \leq 1$). In such a configuration, the base wafer is desirably a GaN wafer.

When the field effect transistor is of an N-channel-type, an example of the second atom is either a C atom or a Zn atom. The insulating layer may be formed to be in contact with the second crystalline layer. In such a configuration, all or a part of the region of the insulating layer, which region is in contact with the second crystalline layer may preferably include aluminum oxide.

According to the second aspect related to the present invention, provided is an insulated gate field effect transistor including: a semiconductor wafer according to the first aspect; the first crystalline layer in the semiconductor wafer as a channel layer; the insulating layer of the semiconductor wafer as a gate insulating layer; and a gate electrode formed directly or indirectly on the gate insulating layer. Note that in the present specification, the expression "formed on" or the like represents a state in which an entity A is formed on an entity B to be in contact with the entity B. The expression "formed above" represents a state in which the entity A is formed away from the entity B in the upper direction of the entity B.

The second crystalline layer may be only formed below the gate electrode. Or a region of the second crystalline layer that includes the second atom may be only formed below the gate electrode. By taking such a configuration, it becomes possible to operate the insulated gate field effect transistor as an enhanced type. Some exemplary methods of introducing the second atom into the second crystalline layer include thermal diffusion and ion implantation.

According to the third aspect related to the present invention, provided is a method for producing a semiconductor wafer according to the first aspect, including: forming the first crystalline layer directly or indirectly on the base wafer by epitaxial growth: forming the second crystalline layer directly or indirectly on the first crystalline layer by epitaxial growth; doping the second crystalline layer with the second atom; and forming the insulating layer directly or indirectly on the second crystalline layer. The second atom may be Zn, and in such a case, the second atom is preferably doped with the Zn by thermal diffusion.

MODE FOR CARRYING OUT THE INVENTION

Figure 1:
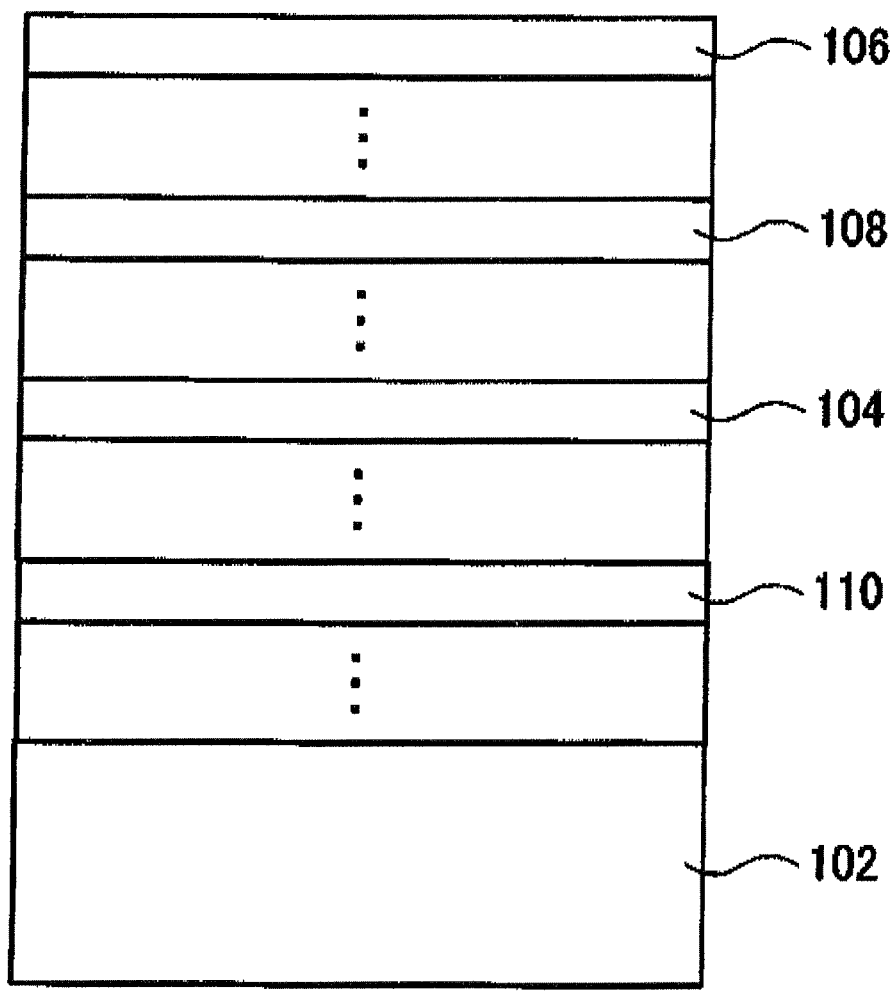
FIG. 1 shows a schematic view of a semiconductor wafer 100.

FIG. 1 shows a schematic view of a semiconductor wafer 100. The semiconductor wafer 100 includes a base wafer 102, a first crystalline layer 104, an insulating layer 106, a second crystalline layer 108, and a third crystalline layer 110. The base wafer 102, the first crystalline layer 104, the second crystalline layer 108, and the insulating layer 106 are disposed in this order. The third crystalline layer 110 in this example is disposed between the base wafer 102 and the first crystalline layer 104. Note that the third crystalline layer 110 may be disposed between the first crystalline layer 104 and the second crystalline layer 108.

As long as a P-HEMT epitaxial layer can be formed thereon, the base wafer 102 can be made of any material and structure. In other words, examples of the material of the base wafer 102 include GaAs, InP, GaN, SiC, Si, sapphire ($Al_2O_3$) or the like, and examples of the structure of the base wafer 102 include single-crystal, polycrystal, and amorphous (non-crystalline). When InGaAs is selected as a channel layer for the P-HEMP structure, and GaAs or AlGaAs is selected as a crystalline layer in heterojunction with the channel layer, it is appropriate to use a GaAs single crystal wafer as the base wafer 102. When selecting GaN or AlGaN as a crystalline layer, it is appropriate to select a GaN wafer, a SiC wafer, a Si wafer, or a sapphire wafer as the base wafer 102.

The first crystalline layer 104 can be used as a channel layer of a field effect transistor. The first crystalline layer 104, when used as a channel layer of a field effect transistor, constitutes an N-channel-type or P-channel-type channel. In the N-channel-type channel, a free electron will function as a carrier and perform conduction, and a hole will function as a carrier and perform conduction in the P-channel-type channel. When the base wafer 102 is made of GaAs, an exemplary material of the first crystalline layer 104 is $In_xGa_{1-x}As$ ($0 \leq x \leq 1$). When the base wafer 102 is made of InP, an exemplary material of the first crystalline layer 104 is $In_xGa_{1-x}As$ ($0 \leq x \leq 1$). When the base wafer 102 is made of GaN, SiC, Si, or sapphire, an exemplary material of the first crystalline layer 104 is $In_yGa_{1-y}N$ ($0 \leq y \leq 1$).

The insulating layer 106 can be used as a gate insulating layer of a field effect transistor. The insulating layer 106, as long as usable as a gate insulating layer or a field effect transistor, can be made of any material and structure. Examples of the material of the insulating layer 106 include $Al_2O_3$, $HfO_2$, $SiO_2$, $Si_3N_4$, or the like, and examples of the structure of the insulating layer 106 include single-crystal, polycrystal, and amorphous (non-crystalline). However, it is preferable to select a material having a high dielectric constant, such as $Al_2O_3$, $HfO_2$, or the like, so as to make the effective film thickness of a gate insulating film to be as thin as possible.

Examples of the depositing method of the insulating layer 106 include vacuum evaporation, sputtering, thermal-CVD (thermal chemical vapor deposition), PCVD (plasma chemical vapor deposition), CATCVD (catalytic chemical vapor deposition), MOCVD (metal organic chemical vapor deposition), MBE (molecular beam epitaxy), of which ALD (atomic layer deposition) is particularly preferable so as to reduce the interface states. Examples of making a film for each crystalline layer include MOCVD, MBE, or the like, of which MOCVD (metal organic chemical vapor deposition) is particularly preferable in terms of its advantage in productivity.

The second crystalline layer 108 is made of a crystal that either lattice matches or pseudo lattice matches the crystal constituting the first crystalline layer 104, and has a larger band gap than the crystal constituting the first crystalline layer 104. The second crystalline layer 108 includes a second atom that functions as a dopant. The second crystalline layer 108 includes an acceptor as the second atom, when the first crystalline layer 104 is used as a channel layer of an N-channel-type field effect transistor. When the first crystalline layer 104 is used as a channel layer of a P-channel-type field effect transistor, the second crystalline layer 108 includes a donor atom as the second atom.

The third crystalline layer 110 is made of a crystal that either lattice matches or pseudo lattice matches the crystal constituting the first crystalline layer 104, and has a larger band gap than the crystal constituting the first crystalline layer 104. The third crystalline layer 110 includes a first atom that functions as a dopant. The third crystalline layer 110 includes a donor atom as the first atom when the first crystalline layer 104 is used as a channel layer of an N-channel-type field effect transistor. When the first crystalline layer 104 is used as a channel layer of a P-channel-type field effect transistor, the third crystalline layer 110 includes an acceptor atom as the first atom. Examples or the second atom or the first atom that functions as an acceptor (acceptor atom) include C, Zn, Mg, or the like. Examples of the second atom or the first atom that functions as a donor (donor atom) include Si, S, Ge, Te, Se, or the like.

When the acceptor atom is doped into the second crystalline layer 108 or to the third crystalline layer 110, a negative fixed space charge is formed by means of a usually adopted temperature of about 300 K. When the donor atom is doped into the second crystalline layer 108 or to the third crystalline layer 110, a positive fixed space charge is formed by means of a usually adopted temperature of about 300 K. By doping the acceptor atom into the second crystalline layer 108, a fixed space charge is formed, and this fixed space charge may be utilized to modulate the potential in the vicinity of the interface between the gate insulating layer and the adjacent semiconductor thereto. As long as such a fixed space charge is formed, there is no need for the second crystalline layer 108 to make p-type conduction. When a donor atom is doped into the second crystalline layer 108, the donor atom is activated thereby forming a fixed space charge. In this case, too, as long as such a fixed space charge is formed, there is no need for the second crystalline layer 108 to make n-type conduction.

The sheet concentration $N_1$ of the first atom and the sheet concentration $N_2$ of the second atom satisfy the relation stated below as Expression 1.

$$N_{0min} + SF_{min} \times N_2 < N_1 < N_{0max} + SF_{max} \times N_2 \quad \text{EXPRESSION 1}$$

Note that $N_{0min}$ and $N_{0max}$ are respectively the minimum value and the maximum value of the sheet concentration $N_0$ of the first atom where the threshold voltage of the field effect transistor becomes a design value when no second atom is doped into the second crystalline layer 108. $SF_{min}$ and $SF_{max}$ are respectively the minimum value and the maximum value of the structural factor SF showing the layer structure of a field effect transistor.

The second atom included in the second crystalline layer 108 is preferably distributed nearer the insulating layer 106. This corresponds to lowering the electric film thickness $(d/\in)_2$. The distance between the interface nearer the second crystalline layer 108 of the insulating layer 106 (MOS interface) and the first crystalline layer 104 as well as the thickness of the insulating layer 106 (gate insulating film) affects the transconductance of the transistor. Since the trans conductance becomes larger as the distance between the MOS interface and the first crystalline layer 104 becomes smaller, it is preferable to shorten this distance. However, as the distance becomes shorter, the effect of doping the second atom will be reduced. Therefore, it is preferable to increase the amount of the impurity atom to be doped into the second crystalline layer 108 as much as possible. However, there is a limit in the amount of the impurity to be doped, and so there is a tradeoff between the effect of doping an impurity atom and transconductance of a transistor. The distance between the MOS interface and the first crystalline layer 104 is desirably 30 nm or less. The relation between the thickness of the insulating layer 106 (gate insulating film) and the film thickness of the crystalline layers from the insulating layer 106 to the first crystalline layer 104 is determined taking into other design limitations, so it is preferable to increase the aforementioned effective electric film thickness as much as possible.

When the base wafer 102 is GaAs and the first crystalline layer 104 is $In_xGa_{1-x}As$ (0≤x≤1), an example of the second crystalline layer 108 may be $In_kAl_mGa_{1-k-m}As_nP_{1-n}$ (0≤k≤1, 0≤m≤1, 0≤k+m≤1, 0≤n≤1). When the base wafer 102 is InP and the first crystalline layer 104 is $In_xGa_{1-x}As$ (0≤x≤1), an example of the second crystalline layer 108 may be $In_kAl_mGa_{1-k-m}As_nP_{1-n}$ (0≤k≤1, 0≤m≤1, 0≤k+m≤1, 0≤n≤1). When the base wafer 102 is GaN, SiC, Si, or sapphire, and the first crystalline layer 104 is $In_yGa_{1-y}N$ (0≤y≤1), an example of the second crystalline layer 108 may be $In_pAl_qGa_{1-p-q}N$ (0≤p≤1, 0≤q≤1, 0≤p+q≤1).

When the base wafer 102 is GaAs, the first crystalline layer 104 is preferably $In_xGa_{1-x}As$ (0≤x≤1) that either lattice matches or pseudo lattice matches GaAs, and the second crystalline layer 108 is preferably $Al_mGa_{1-m}As$ (0≤m≤1). Still alternatively, when the base wafer 102 is GaAs, the first crystalline layer 104 is preferably $In_xGa_{1-x}As$ (0≤x≤1) that either lattice matches or pseudo lattice matches GaAs, and the second crystalline layer 108 is preferably $In_kAl_mGa_{1-k-m}P$ (0≤k≤1, 0≤m≤1, 0≤k+m≤1). When the second crystalline layer 108 is $In_kAl_mGa_{1-k-m}P$ (0≤k≤1, 0≤m≤1, 0≤k+m≤1) and the field effect transistor is of an N-channel-type, the second crystalline layer 108 is preferably $In_kAl_mGa_{1-k-m}P$ (0≤k≤1, 0≤m≤1, 0≤k+m≤1) that has a natural superlattice, and especially $In_kGa_{1-k}P$ (0≤k≤1).

In the semiconductor wafer 100, the impurity exhibiting a conductivity type that is opposite to the conductivity type of the carrier making conduction to the first crystalline layer 104, when the semiconductor wafer 100 is used as a field effect transistor, is introduced into the second crystalline layer 108 having a wider band gap than the first crystalline layer 104 functioning as a channel layer. This will help reduce an adverse effect due to the MOS interface states when modulating, using the gate voltage, the carrier density of the channel layer in the insulated gate field effect transistor structure. The mechanism that enables to reduce the adverse effect due to the MOS interface states will be detailed later. Note that in this specification "carrier density" is occasionally referred to as "carrier concentration."

Embodiment Examples

Figure 2:
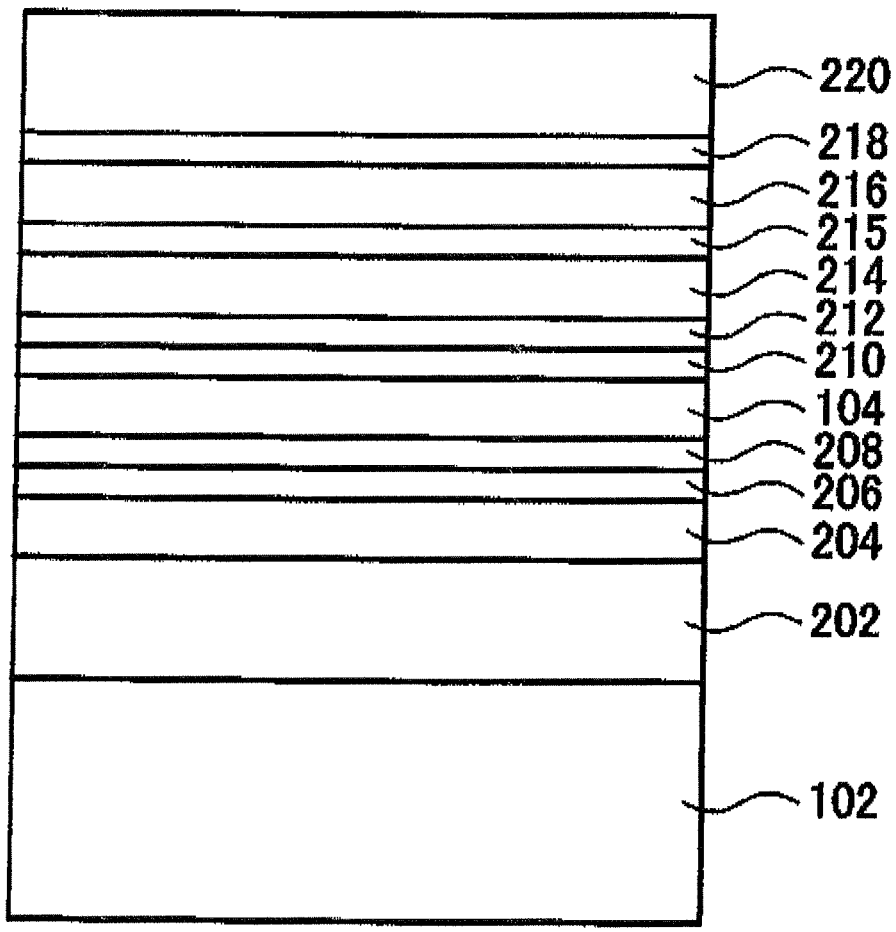
FIG. 2 shows a schematic view of a semiconductor wafer 200.

A semiconductor wafer 200 as shown in FIG. 2 was produced. As a semiconductor wafer 200, a buffer layer 202, a doping layer 204, a first spacer layer 206, a second spacer layer 208, a first crystalline layer 104, a third spacer layer 210, a fourth spacer layer 212, a doping layer 214, a non-doped layer 215, a second channel layer 216, an etching stopper layer 218, and a contact layer 220 are formed in this order on the base wafer 102.

A GaAs single-crystal wafer was used as the base wafer 102. On the base wafer 102, a non-doped $Al_{0.25}Ga_{0.75}As$ layer and a non-doped GaAs layer are formed to a thickness of 800 nm or more, as the buffer layer 202. On the buffer layer 202, an n-type $Al_{0.24}Ga_{0.76}As$ layer was formed to a thickness of 5 nm, as the doping layer 204. A Si atom was used as an n-type dopant, and the impurity concentration was adjusted to be $2.0×10^{18}$ cm$^{-3}$. On the doping layer 204, a non-doped $Al_{0.24}Ga_{0.76}As$ layer was formed to a thickness or 4 nm as a first spacer layer 206. On the first spacer layer 206, a non-doped GaAs layer was formed to a thickness of 5 nm, as a second spacer layer 208.

On the second spacer layer 208, a non-doped $In_{0.3}Ga_{0.7}As$ layer was formed to a thickness of 7.5 nm as a first crystalline layer 104. On the first crystalline layer 104, a non-doped GaAs layer was formed to a thickness of 5 nm as a third spacer layer 210. On the third spacer layer 210, a non-doped $Al_{0.24}Ga_{0.76}As$ layer was formed to a thickness of 2 nm as a fourth spacer layer 212. On the fourth spacer layer 212, an n-type $Al_{0.24}Ga_{0.76}As$ layer was formed to a thickness of 6 nm as a doping layer 214. In this n-type $Al_{0.24}Ga_{0.76}As$ layer, a Si atom was used as the n-type dopant, and the impurity concentration was adjusted to be $2×10^{18}$ atoms/cm$^{-3}$ (hereinafter occasionally referred to as cm$^{-3}$). On the doping layer 214, a non-doped $Al_{0.24}Ga_{0.76}As$ layer was formed to a thickness of 2 nm as a non-doped layer 215. On the non-doped layer 215, a non-doped GaAs layer was formed to a thickness of 10 nm as a second channel layer 216.

On the second channel layer 216, an n-type $In_{0.48}Ga_{0.52}P$ layer was formed to a thickness of 10 nm as an etching stopper layer 218. A Si atom was used as the n-type dopant, and the impurity concentration was adjusted to be $1×10^{18}$ cm$^{-3}$. Finally, on the etching stopper layer 218, an n-type GaAs layer was formed to a thickness of 100 nm as a contact layer 220. Here, a Si atom was used as the n-type dopant, and the impurity concentration was adjusted to $5×10^{18}$ cm$^{-3}$.

The AlGaAs layer, the InGaAs layer, and the GaAs layer were formed by MOCVD (metal organic chemical vapor deposition). As a source gas of an Al atom, an In atom, a Ga atom, and an As atom, TMA (trimethylalutninum), TMI (trimethylindium), TMG (trimethylgallium), and arsine ($AsH_3$) were used. As a source gas for a P atom, phosphine ($PH_3$) was used. As a source gas of a Si atom, disilane ($Si_2H_6$) was used. The semiconductor wafer 200 was fabricated accordingly.

Figure 3:
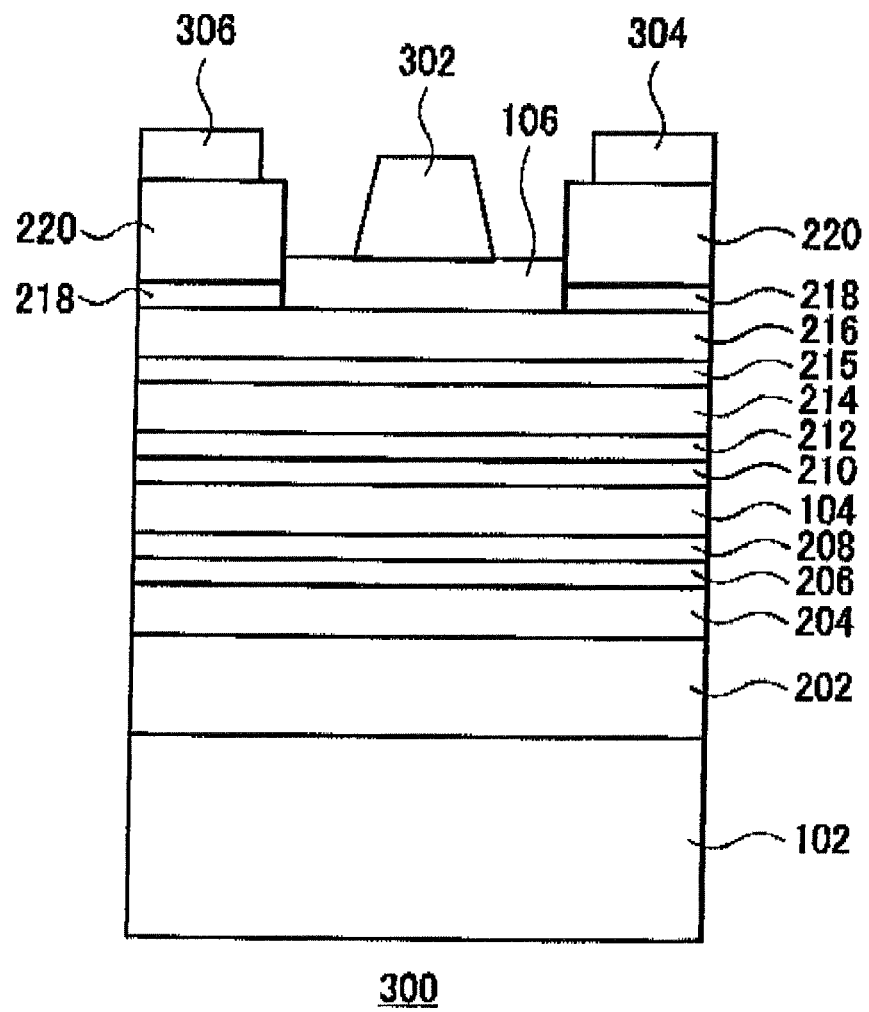
FIG. 3 shows a schematic view of an insulated gate field effect transistor 300.

An insulated gate field effect transistor 300 of FIG. 3 was produced as a prototype. The insulated gate field effect transistor 300 was produced based on the semiconductor wafer 200 of FIG. 2. Etching was conducted to remove the contact layer 220 and the etching stopper layer 218 in the region in which the gate electrode 302 is to be formed (gate electrode forming region). Thereafter, an $Al_2O_3$ layer was formed to a thickness of 12 nm on its entire surface as an insulating layer 106. The $Al_2O_3$ layer was formed by ALD. A gate electrode 302 was formed on the insulating layer 106 in the gate electrode forming region. The insulating layer 106 in the region in which the source electrode 304 and the drain electrode 306 were to be formed was removed, thereby forming the source electrode 304 and the drain electrode 306. The source electrode 304 and the drain electrode 306 were formed to sandwich the gate electrode 302 therebetween, so that they are respectively electrically connected to the channel under the gate electrode 302. The gate electrode 302 was formed by forming the laminated film of Ti/Pt/Au by vacuum evaporation, and patterning the laminated film by a lift-off technique. The source electrode 304 and the drain electrode 306 were formed by forming the laminated film of AuGe/Ni/Au by vacuum evaporation, and patterning the laminated film by a lift-off technique.

Two channels were formed in the insulated gate field effect transistor 300; one is the first channel formed in the non-doped $In_{0.3}Ga_{0.7}As$ layer that is the first crystalline layer 104, and the other is a second channel that is formed on the non-doped GaAs layer that is the second channel layer 216.

Figure 4:
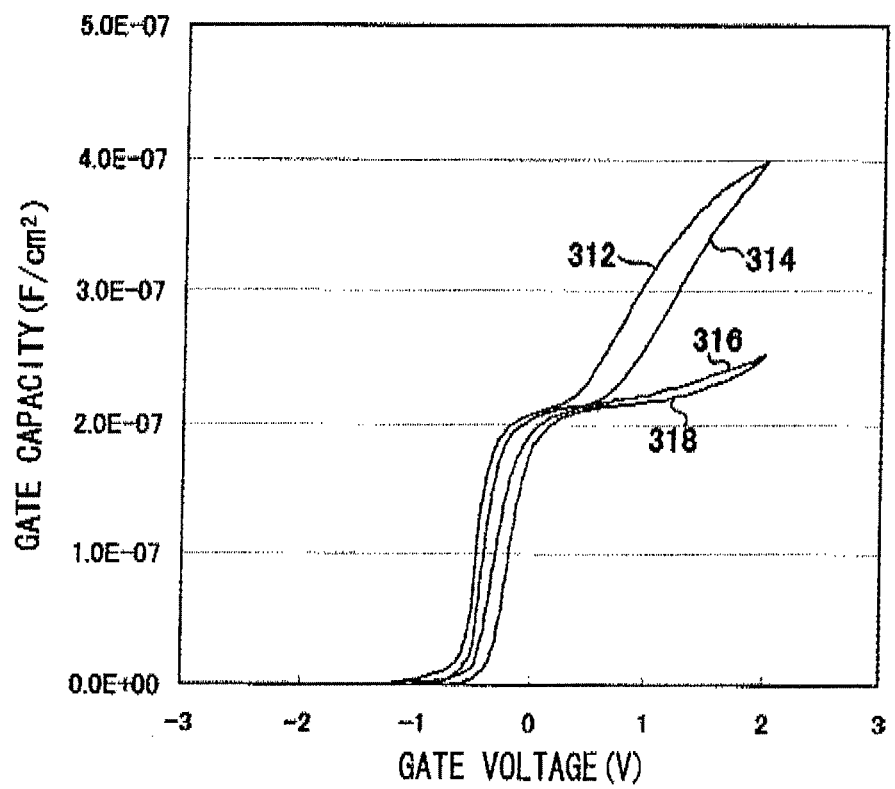
FIG. 4 shows a graph showing a relation of the gate capacity in relation to the gate voltage (C-V characteristic) of the insulated gate field effect transistor 300, having been obtained by an experiment.

FIG. 4 shows a graph showing a relation of the gate capacity with respect to the gate voltage (C-V characteristic) of the insulated gate field effect transistor 300, having been obtained by an experiment. The line 312 represents a C-V characteristic when the measuring frequency was 1 kHz and the gate voltage was seamed from −2 V to +2 V. The line 314 represents a C-V characteristic when the measuring frequency was 1 kHz and the gate voltage was scanned from +2 V to −2 V. The line 316 shows a C-V characteristic when the measuring frequency was 1 MHz and the gate voltage was scanned from −2 V to +2 V, and the line 318 represents a C-V characteristic when the measuring frequency was 1 MHz and the gate voltage was scanned from +2 V to −2 V. In the region in which the gate voltage is smaller than about 0 V, there is no difference observed between the C-V characteristics for different measuring frequencies (frequency dispersion), and it is seen that the gate voltage can modulate the carrier density favorably. On the contrary, in the region in which the gate voltage is larger than about 0 V, the frequency dispersion can be observed, and in the high frequency (1 MHz), hardly any modulation of the carrier density by the change in gate voltage can be observed.

Figure 5:
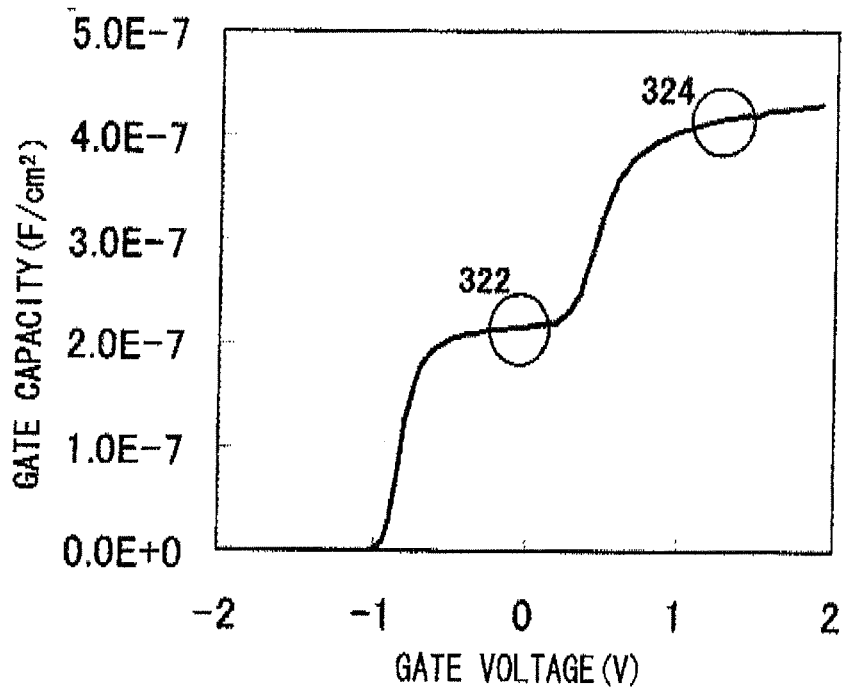
FIG. 5 shows a simulated C-V characteristic of the insulated gate field effect transistor 300 on condition that it has an ideal MOS interface which no interface state exists.

FIG. 5 shows a C-V characteristic obtained by simulation performed by assuming a condition in which no interface states exists at the MOS interface of the insulated gate field effect transistor 300. Note that the band gap energy of the $Al_2O_3$ layer that is the insulating layer 106 was set to be 6.0 eV and the relative permittivity thereof was set to be 7. The work function of the gate electrode 302 was set to 4.83 eV. The band gap center at the interface between the base wafer 102 (GaAs single-crystal wafer) and the buffer layer 202 (laminated structure between the non-doped $Al_{0.25}Ga_{0.75}As$ layer and the non-doped GaAs layer) was pinned to 0 V. The simulator adopted a first dimensional Schroedinger-Poisson method. In other words, the wave function was denoted using a Schroedinger's equation, the carrier concentration was denoted using a Fermi-Dirak statistics, and the band potential was denoted using a Poisson equation. They were solved in a self-contradictory manner, thereby obtaining the profile of the band potential and the carrier concentration profile.

Comparing the experiment data of FIG. 4 and the simulation of FIG. 5, it is noted that the experiment data matches the simulation well in the region in which the gate voltage is smaller than about 0 V, and in the region in which the gate voltage is larger than about 0 V, the experiment data does not quite match the simulation.

Figure 6:
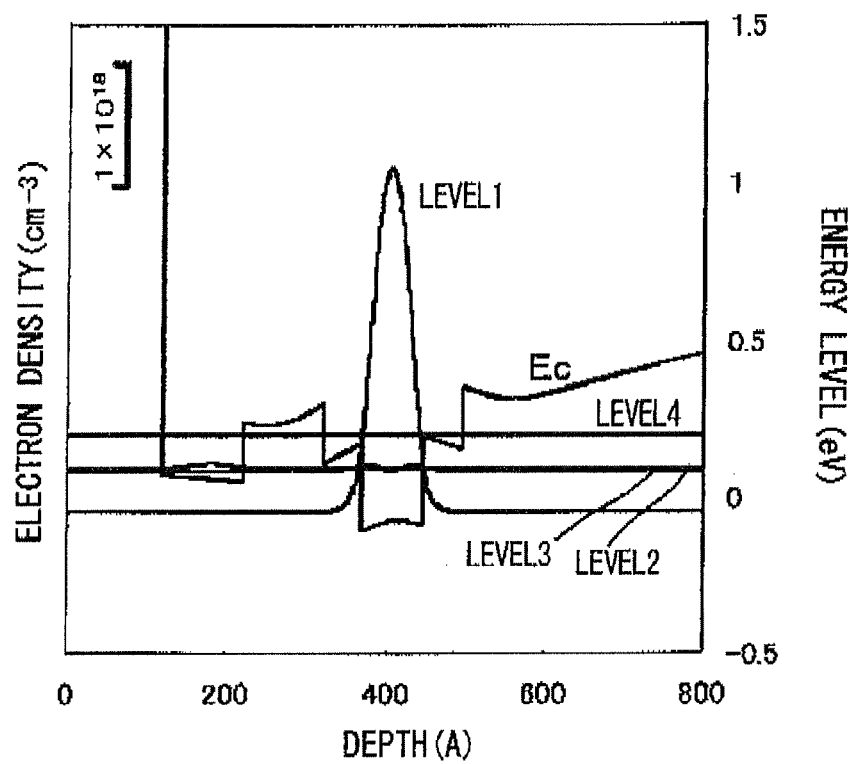
FIG. 6 shows a simulated depth profile of the electron density, with the gate voltage of 0 V.
Figure 7:
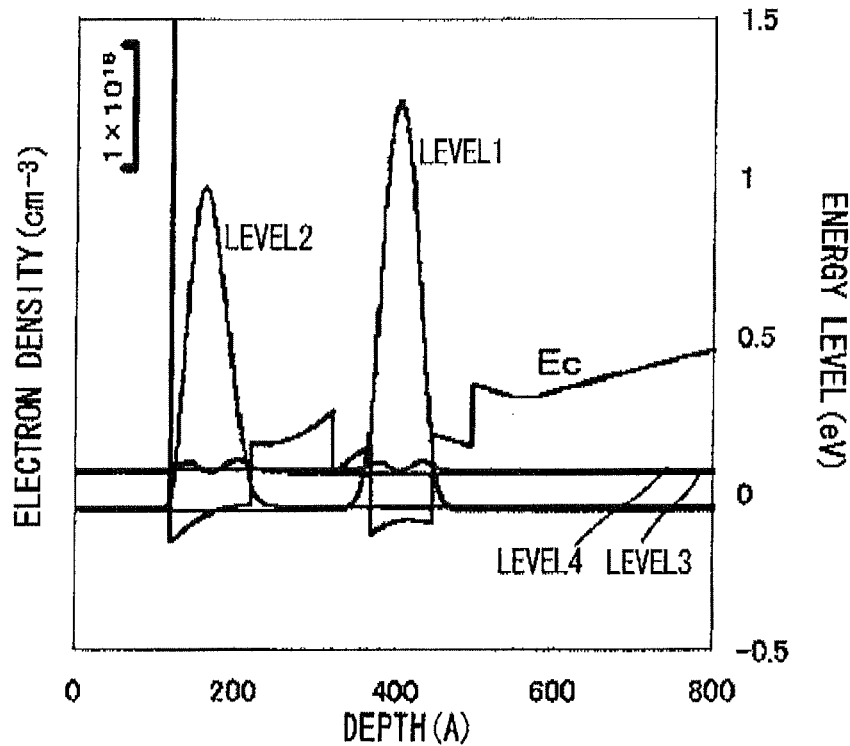
FIG. 7 shows a simulated depth profile of the electron density, with the gate voltage of +1.2 V.

FIG. 6 and FIG. 7 respectively show a simulated depth profile of the electron density in for the four quantum levels (the gate voltage is 0 V in FIG. 6 and the gate voltage is +1.2 V in FIG. 7). Please note that the electron density is occasionally denoted as "electron concentration." FIG. 6 and FIG. 7 also show the depth profile (Ec) of the energy level at the lower edge of the conduction band. The baseline of the electron density profile for each of the four quantum levels (level 1, level 2, level 3, and level 4) shows that the electron density of 0 as well as the energy level of each level. The length of the unit scale of the electron density ($1 \times 10^{18}$ cm$^{-3}$) is shown in the upper left portion of the drawing. The energy level scale is shown at the right-side vertical axis. What the right-side vertical axis represents is an energy level with reference to the Fermi level at the MOS interface, and its unit is in electron energy (eV).

The level 1 is the lowest energy level, and the energy level increases in the order of the level 2, the level 3, and the level 4. In FIG. 6 and FIG. 7, the depth 0-120 Å corresponds to the insulating layer 106, the depth 120-220 Å corresponds to the second channel layer 216, the depth 220-300 Å corresponds to the non-doped layer 215 and the doping layer 214, and the depth 300-320 Å corresponds to the fourth spacer layer 212, the depth 320-370 Å corresponds to the third spacer layer 210, the depth 370-445 Å corresponds to the first crystalline layer 104, the depth 445-495 Å corresponds to the second spacer layer 208, the depth 495-535 Å corresponds to the first spacer layer 206, the depth 535-585 Å corresponds to the doping layer 204, and the region deeper than 585 Å corresponds to the buffer layer 202.

FIG. 6 reveals that when the gate voltage is 0 V, the Free electrons in the state of the level 1 are accumulated in the first crystalline layer 104 (first channel) having a depth of 370-445 Å. On the other hand, no substantial increase is observed in the density of the free electrons in the level 2, the level 3, and the level 4.

You can see from FIG. 7 that when the gate voltage is 1.2 V, the free electron in the state of the level 1 is accumulated in the first crystalline layer 104 (first channel), and the free electron in the state of the level 2 is accumulated in the second channel layer 216 (second channel) having a depth of 120-220 Å.

Figure 8:
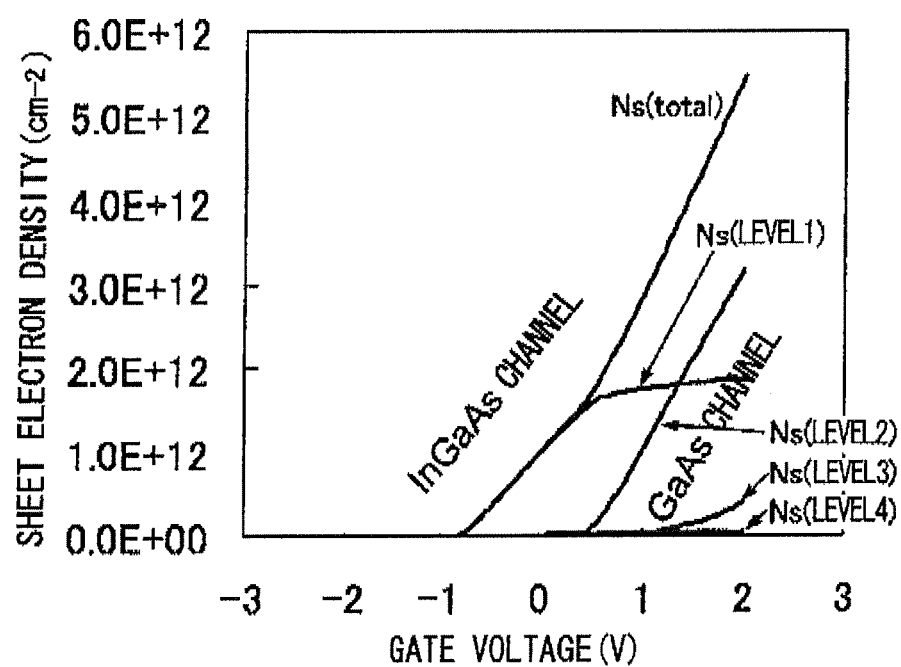
FIG. 8 shows a simulated results of the sheet electron density for each Quantum level with respect to change in gate voltage.

FIG. 8 shows the result of a simulation conducted regarding the change of the sheet electron density in response to the change in gate voltage, respectively for the first channel (denoted as "InGaAs channel" in the drawings) and the second channel (denoted as "GaAs channel" in the drawings). As the gate voltage is boosted from about −0.8 V, the electron density for the first channel ("InGaAs channel") starts to increase. When the gate voltage reaches about 0.5 V and the electron density of the first channel ("InGaAs channel") starts to saturate, the electron density of the second channel ("GaAs channel") starts to increase. The total electron density monotonically increases in response to the increase in the gate voltage. When an insulated gate field effect transistor is created using the semiconductor wafer of the present invention, the transistor channel uses semiconductor heterojunction, in which mainly the InGaAs channel performs conduction, with the GaAs channel functioning as a parasitic channel in many cases. In other words, preferably, the electron density at which the InGaAs channel saturates is as high as possible, and the gate voltage at which the electron density of the GaAs channel starts to increase is preferably as high as possible.

From the simulations shown in FIG. 5 through FIG. 8, the following model can be conceived of. Specifically in the model, first of all, a free electron starts to accumulate in the first channel (first crystalline layer 104), and up to when the gate voltage reaches about 0.5 V, the free electron density increases for the first channel (First crystalline layer 104), which is as shown in the circle 322 drawn for the C-V characteristic in FIG. 5. As the gate voltage further increases exceeding about 0.5 V, the second channel (second channel layer 216) also starts to accumulate a free electrons, which is as shown in the circle 324 drawn in the C-V characteristic line in FIG. 5. Taking these models in mind, the C-V characteristic (actual measured value) of FIG. 4 can be interpreted such that the frequency dispersion is small in the state in which the gate voltage is smaller than about 0.5 V and that the carrier is conducted in the first channel (first crystalline layer 104), and the carrier is normally modulated in this state. In the state in which the gate voltage is larger than about 0.5 V and that the carrier is conducted in the first channel (first crystalline layer 104) and the second channel (second channel layer 216), the frequency dispersion is large, and it exhibits a typical pinning characteristic having a high interface state density, and it is presumed that the carrier is not modulated normally.

The following is the inventors' consideration as to the reason for favorable carrier modulation in the first crystalline layer 104 (InGaAs layer) which is the first channel as well as unfavorable carrier modulation in the second channel layer 216 (GaAs layer) that is the second channel, as follows.

Figures 9A, 9B:
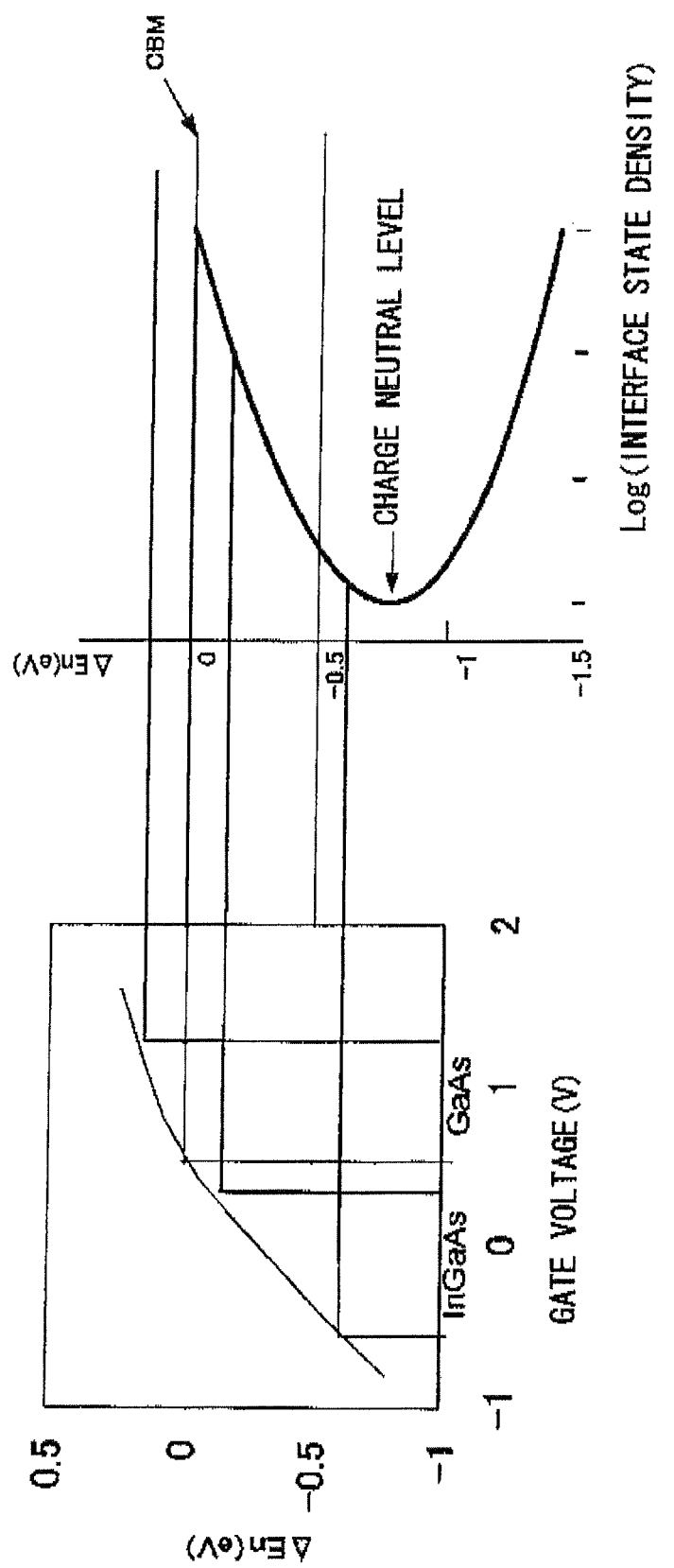
FIG. 9(a) shows a plot of a calculated value of the Fermi level at the MOS interface when the gate voltage is changed, and (b) shows a schematic diagram of a relation between the interface state density and its energy level in GaAs.

FIG. 9 (a) shows a plot of a calculated value of the Fermi level at the MOS interface when the gate voltage was changed. Here, the MOS interface is an interface between the second channel layer 216 and the insulating layer 106. On the vertical axis of FIG. 9 (a), the energy difference from the lower edge of the conduction band is represented as $\Delta En(eV)$. The lower the gate voltage is, the lower the Fermi level becomes at the MOS interface. On the other hand, FIG. 9 (b) shows a relation between the interface state density and its energy level in GaAs. On the vertical axis of FIG. 9(b), the energy difference from the lower edge of the conduction band is represented as $\Delta En(eV)$, and the horizontal axis represents the interface state density in the logarithm scale (in any arbitrary value). Generally speaking, the interface state density lowers as the energy approaches the charge neutrality level, and at the charge neutrality level, the interface state density reaches its minimum. Note that "charge neutrality level" is a state in the gap of the semiconductor, and is defined to be a boundary level that neutralizes the valance character and the conduction character, which is between the donor-like state near the upper edge of the valence band and the acceptor-like state near the lower end of the conduction band.

(a) and (b) in FIG. 9 are matched each other both in terms of the scale on the vertical axes as well as the level on the lower edge of the valance bands. The range of the gate voltage in which there occurs carrier modulation in the first crystalline layer 104 (InGaAs layer) corresponds to the range indicated by "InGaAs" in FIG. 9 (a), and the range of the gate voltage in which there occurs carrier modulation in the second channel layer 216 (GaAs layer) corresponds to the range indicated by "GaAs" in FIG. 9 (a). $\Delta En$ (i.e., the Fermi level at the MOS interface with reference to the lower end of the conduction band) corresponding to the range indicated by "InGaAs" is nearer the charge neutrality level than $\Delta En$ corresponding to the range indicated by "GaAs", and the interface state density is also smaller for the range of "InGaAs." That is, the channel modulation in the first crystalline layer 104 is operated in a state in which the effect of the interface state density is reduced compared to the carrier modulation occurring in the second channel layer 216. The reason why the carrier modulation is conducted more favorably in the first crystalline layer 104 than in the second channel layer 216 is that the operation is conducted with the Fermi level at the MOS interface closer to the charge neutrality level.

In the prototype of the insulated gate field effect transistor 300, the Fermi level at the MOS interface when the InGaAs channel is modulated is shifted towards the upper edge of the valance hand which is deeper than the lower edge of the conduction band, thereby obtaining a C-V characteristic with smaller frequency dispersion, which represents a favorable result. A part of the reason caused this favorable result is that the threshold voltage Vt of the insulated gate field effect transistor 300 has a comparatively larger negative value.

In the case of an N-channel-type insulated gate field effect transistor, it is practically very important to obtain a normally-off transistor in which the threshold voltage Vt is a positive value. When the threshold voltage has become a positive value, the Fermi level at the MOS interface with the InGaAs channel being modulated will be raised up to the lower edge side of the conduction band, which degrades the characteristic of the field effect transistor. Specifically, the effect of the interface state will become large during the operation of the transistor. Further, the electron density of the InGaAs channel at which the electron density starts to increase in the GaAs channel will be lowered. It is desired to shift the Fermi level at the MOS interface further towards the upper edge of the valance band even when the threshold voltage Vt of the field effect transistor is a positive value.

The inventors of the present application have made the present invention based on the above-stated findings. In other words, they made efforts to adjust the epitaxial layer configuration between the first crystalline layer 104 and the insulating layer 106 so as to obtain the Fermi level at the MOS interface closer to the charge neutrality level. Although it is first and foremost important to fabricate a gate insulating film that has a small interface state density so as to operate MOS favorably in the transistor, it is difficult to completely eliminate the interface states. It is particularly difficult to eliminate the state density in the tail state portion near the edge of the band, because the state density there is much larger than the state density near the charge neutrality level. Therefore, in addition to providing a technique of forming a MOS interface with a low interface state density, it is of crucial importance to prepare a technology that enables to reduce the effect of the interface states currently existing, if we try to put the MOS-type P-HEMT into actual practice.

Table 1 shows a layer structure of the semiconductor wafer 400 showing one embodiment example of the present invention. Each layer shown in Table 1 was formed on a GaAs wafer in the order starting from the smaller reference numbers, thereby creating the semiconductor wafer 400. The semiconductor wafer 400 is used in an N-channel-type field effect transistor,

TABLE 1

| NO. | STRUCTURE | FILM THICKNESS (nm) | DOPING CONCENTRATION ($cm^{-3}$) |
|---|---|---|---|
| 420 | $Al_2O_3$ | 12 | — |
| 418 | i-$Al_{0.24}Ga_{0.76}As$ | 2 | — |
| 416 | p-$Al_{0.24}Ga_{0.76}As$ | 6 | $5.0 \times 10^{18}$ |
| 414 | i-$Al_{0.24}Ga_{0.76}As$ | 2 | — |
| 412 | i-GaAs | 5 | — |
| 410 | i-$In_{0.3}Ga_{0.7}As$ | 7.5 | — |
| 408 | i-GaAs | 5 | — |
| 406 | i-$Al_{0.24}Ga_{0.76}As$ | 2 | — |
| 404 | n-$Al_{0.24}Ga_{0.76}As$ | 5 | $4.85 \times 10^{18}$ |
| 402 | i-GaAs/i-$Al_{0.25}Ga_{0.76}As$ LAYER STRUCTURE | 500 | — |

The layer 402 has a layer structure of the non-doped GaAs layer and the non-doped $Al_{0.25}Ga_{0.75}As$ layer. The sum of the film thickness of the layer 402 is set to 500 nm. The layer 402 can function as a buffer layer. Note that the thickness the layer 402 is different from the buffer layers 202 in the semiconductor wafer 200 in FIG. 2 and the insulated gate field effect transistor 300 in FIG. 3, however the effect of the difference to the present invention is negligible.

The layer 404 is an $Al_{0.24}Ga_{0.76}As$ layer having a thickness of 5 nm in which a first atom has been doped. The layer 404 is an example of the third crystalline layer or the fourth crystalline layer. The layer 404 has a wider band gap than the first crystalline layer 104, and includes a donor atom as, first atom. The doping concentration of the donor atom was set to $4.85 \times 10^{18}$ $cm^{-3}$. The layer 404 can function as a threshold adjusting layer for adjusting the threshold value of the transistor, for example. In other words, the doping amount of the donor atom of the layer 404 can be adjusted in accordance with the doping amount of the acceptor atom of the layer 416, to obtain a constant threshold value for the transistor. In the present example, the doping amount was adjusted for the layer 404 and for the layer 416, so as to yield a threshold voltage of the transistor of +0.2 V.

The layer 406 and the layer 414 are a non-doped $Al_{0.24}Ga_{0.76}As$ layer having a thickness of 2 nm, and the layer 408 and the layer 412 are a non-doped GaAs layer having a thickness of 5 nm. The layer 406, the layer 414, the layer 408, and the layer 412 can function as a spacer layer. The layer 410 is a non-doped $In_{0.3}Ga_{0.7}As$ layer having a thickness of 7.5 nm. The layer 410 is an example of the first crystalline layer 104.

The layer 416 is an $Al_{0.24}Ga_{0.76}As$ layer having a thickness of 6 nm in which a second atom has been doped. The layer 416 is an example of the second crystalline layer 108. The layer 416 includes an acceptor atom as the second atom. The doping concentration of the acceptor atom was set to $5.0 \times 10^{18}$ $cm^{-3}$.

The layer 418 is a non-doped $Al_{0.24}Ga_{0.76}As$ layer having a thickness of 2 nm. The layer 420 is an $Al_2O_3$ layer having a thickness of 12 nm. The layer 420 is an example of the insulating layer 106. Note that the band gap energy of the layer 420 was set to be 6.0 eV and the specific permittivity thereof was set to be 7.

Figure 10:
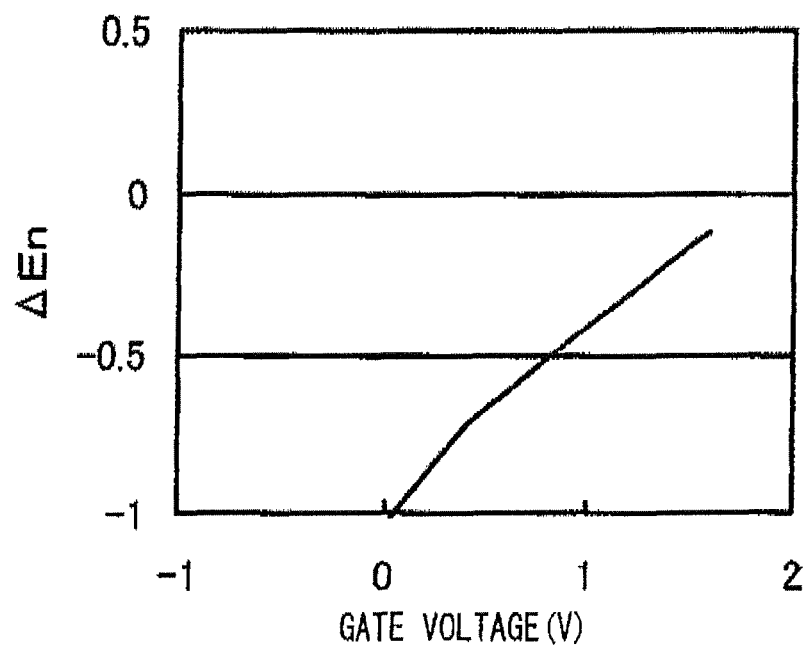
FIG. 10 shows a plot of a calculated value of the Fermi level at the MOS interface of the semiconductor wafer 400 when the gate voltage is changed.

FIG. 10 shows a plot of a calculated value of the Fermi level at the MOS interface of the semiconductor wafer 400 when the gate voltage was varied. In this calculation, the gate metal was assumed to be formed on the surface of the layer 420 that is functioning as an insulating film. The work function of the gate metal was assumed as 4.83 eV. In addition, the band gap center vicinity of the base wafer surface was pinned to 0 V. It has been found that when the gate voltage is about 0 V to 1.2 V, ΔEn (i.e., the energy difference from the Fermi level of the gate electrode with reference to the lower edge of the conduction band at the MOS interface) is about −1 to −0.3 eV.

Table 2, on the other hand, shows a layer configuration of the semiconductor wafer 500 that is shown as a comparison example with the semiconductor wafer 400 shown in Table 1. Just as in the case or the semiconductor wafer 400, each layer of Table 2 was formed on the GaAs wafer in the order starting from the smaller reference numbers, thereby creating the semiconductor wafer 500. The semiconductor wafer 500 is used for an N-channel-type field effect transistor.

TABLE 2

| NO. | STRUCTURE | FILM THICKNESS (nm) | DOPING CONCENTRATION ($cm^{-3}$) |
|---|---|---|---|
| 420 | $Al_2O_3$ | 12 | — |
| 418 | i-$Al_{0.24}Ga_{0.76}As$ | 2 | — |
| 502 | n-$Al_{0.24}Ga_{0.76}As$ | 6 | $4.35 \times 10^{17}$ |
| 414 | i-$Al_{0.24}Ga_{0.76}As$ | 2 | — |
| 412 | i-GaAs | 5 | — |
| 410 | i-$In_{0.3}Ga_{0.7}As$ | 7.5 | — |
| 408 | i-GaAs | 5 | — |
| 406 | i-$Al_{0.24}Ga_{0.76}As$ | 2 | — |
| 404 | n-$Al_{0.24}Ga_{0.76}As$ | 5 | $4.35 \times 10^{17}$ |
| 402 | i-GaAs/i-$Al_{0.25}Ga_{0.76}As$ LAYER STRUCTURE | 500 | — |

A comparison crystalline layer 502 was formed on the semiconductor 500, instead of the layer 416 in the semiconductor wafer 400. The comparison crystalline layer 502 includes a donor atom and not an acceptor atom included in the layer 416. The configuration that includes the comparison crystalline layer 502 is a general layer structure in the conventional P-HEMT structure. A donor atom having a concentration of $4.35 \times 10^{17}$ $cm^{-3}$ was doped into the comparison crystalline layer 502. In addition, the concentration of the donor atom doped into the layer 404 was set to $4.35 \times 10^{17}$ $cm^3$, thereby adjusting the threshold voltage of the field effect transistor to +0.2 V.

Figure 11:
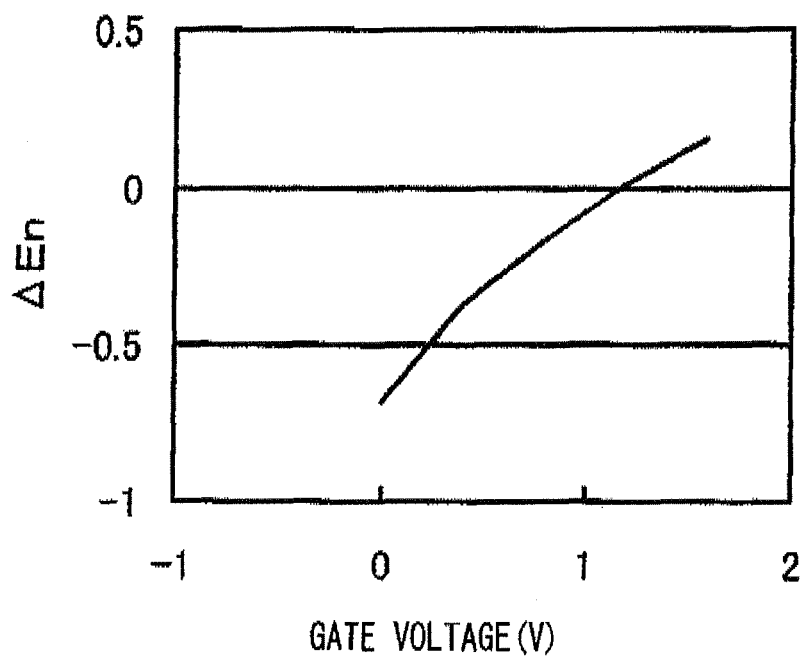
FIG. 11 shows a plot of a calculated value of the Fermi level at the MOS interface of the semiconductor wafer 500 when the gate voltage is changed.

FIG. 11 shows a plot of a calculated value of the Fermi level at the MOS interface of the semiconductor wafer 500 when the gate voltage was varied. Each condition for the calculation was set the same as in the case of FIG. 10. It has been found that when the gate voltage is about 0 V to 1.2 V, ΔEn is about −0.7 to −0.0 eV.

Comparing FIG. 10 and FIG. 11, it can be seen that ΔEn for the semiconductor wafer 400 is lower by about 0.3 eV than the ΔEn for the semiconductor wafer 500 (conventional technology). This indicates the fact that the Fermi level at the MOS interface for the semiconductor wafer 400 is closer to the charge neutrality level than the semiconductor wafer 500 (conventional technology). From this, we can infer that by using the semiconductor wafer 400, the effect of the interface states will be smaller than in conventional cases. To be more specific, the Fermi level moves within a region having a smaller interface state density when the gate voltage is changed at the operation of the field effect transistor. This helps reduce the change in charge amount to be trapped by the interface states. In other words, even with the same MOS interface, there will be a smaller adverse effect in the field effect transistor operation.

Figure 12:
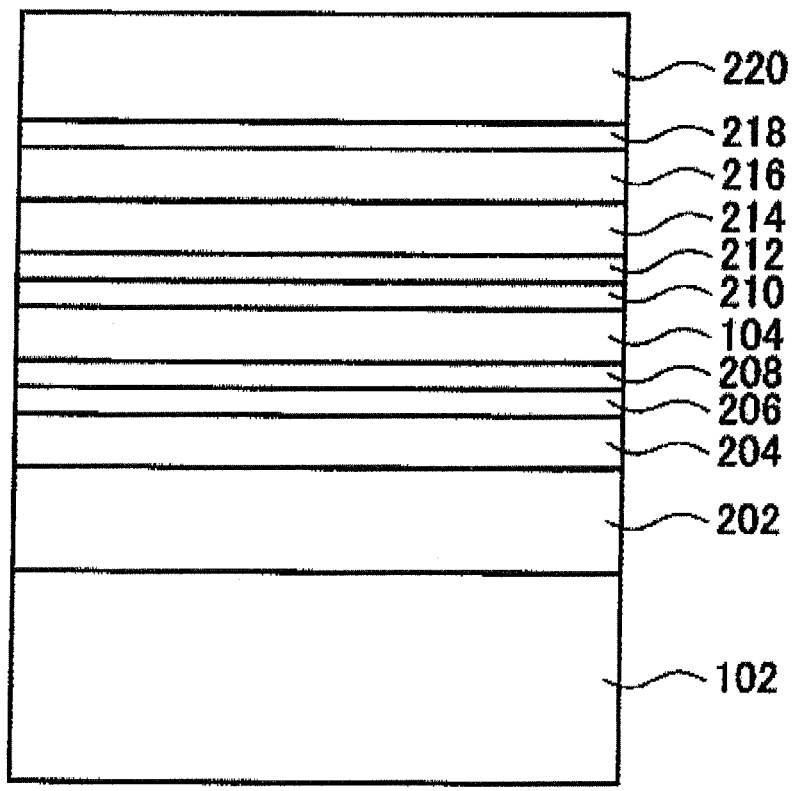
FIG. 12 shows a schematic view of the semiconductor wafer 550.

Next, a different embodiment example is explained. We also created a semiconductor wafer 550 shown in FIG. 12. In this example, we used a GaAs single-crystal wafer as the base wafer 102. On the base wafer 102, we formed a non-doped $Al_{0.25}Ga_{0.75}As$ layer and a non-doped GaAs layer as a buffer layer 202 which amount to a thickness of 800 nm. On the buffer layer 202, an n-type $Al_{0.24}Ga_{0.76}As$ layer having a thickness of 5 nm was formed as a doping layer 204. A Si atom was used as an n-type dopant, and the impurity concentration thereof was adjusted to $2.31 \times 10^{18}$ $cm^{-3}$. On the doping layer 204, a non-doped $Al_{024}Ga_{0.76}As$ layer was formed to a thickness of 4 nm as a first spacer layer 206. On the first spacer layer 206, a non-doped GaAs layer having a thickness of 6 nm was formed as a second spacer layer 208.

On the second spacer layer 208, a non-doped $In_{0.4}Ga_{0.6}As$ layer was formed to a thickness of 5.5 nm as a first crystalline layer 104. On the first crystalline layer 104, a non-doped GaAs layer was formed with a thickness of 6 nm as a third spacer layer 210. On the third spacer layer 210, a non-doped $Al_{0.24}Ga_{0.76}As$ layer was formed as a fourth spacer layer 212 having a thickness of 4 nm. On the fourth spacer layer 212, an n-type $Al_{0.24}Ga_{0.76}As$ layer was formed as the doping layer 214 to a thickness of 10 nm. A Si atom was used as an n-type dopant, and the impurity concentration was adjusted to $3 \times 10^{18}$ $cm^{-3}$. On the doping layer 214, a non-doped $Al_{0.24}Ga_{0.76}As$ layer having a thickness of 10 nm was formed as a non-doping layer 216.

On the non-doping layer 216, an n-type $In_{0.24}Ga_{0.76}P$ layer was formed as an etching stopper layer 218 to a thickness of 10 nm. A Si atom was selected as an n-type dopant, and the impurity concentration was adjusted to $3 \times 10^{18}$ $cm^{-3}$. Finally on the etching stopper layer 218, an n-type GaAs layer was formed to a thickness of 100 nm, as a contact layer 220. A Si atom was used as an n-type dopant, and the impurity concentration was adjusted to $5 \times 10^{18}$ $cm^{-3}$.

The AlGaAs layer, the InGaAs layer, the GaAs layer, and the InGaP layer were formed using MOCVD. As a source gas of an Al atom, an In atom, a Ga atom, and an As atom, TMA (trimethylaluminum), TMI (trimethylindium), TMG (trimethylgallium), TEC (triethyl gallium), and arsine ($AsH_3$) were used. As a source gas for a P atom, phosphine ($PH_3$) was used. As a source gas of a Si atom, disilane ($Si_2H_6$) was used. The semiconductor wafer 550 was fabricated accordingly.

Figure 13:
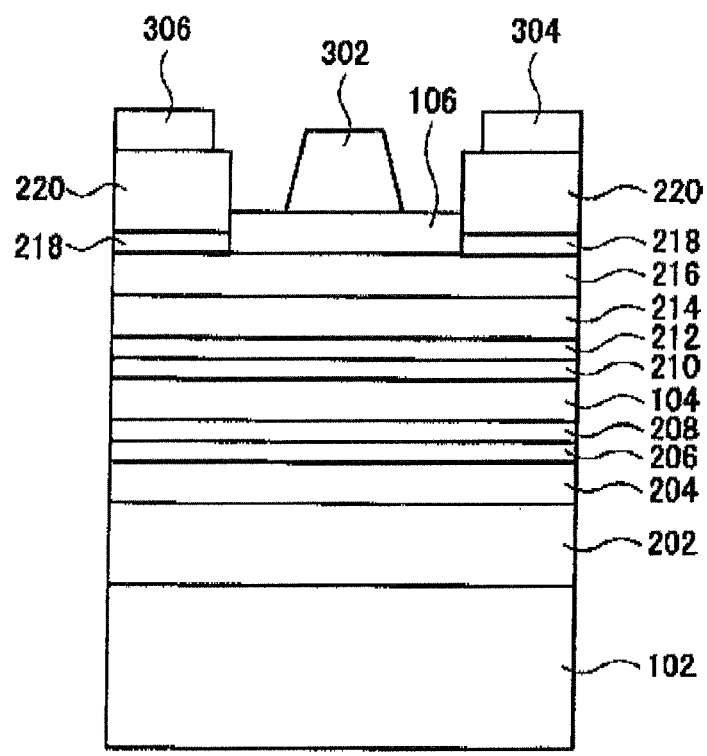
FIG. 13 shows a schematic view of an insulated gate field effect transistor 560.

Using the semiconductor wafer 550, the insulated gate field effect transistor 560 as shown in FIG. 13 was produced as a prototype. Etching was conducted to remove the contact layer 220 and the etching stopper layer 218 in the region in which the gate electrode 302 is to be formed (gate electrode forming region). Thereafter, on the entire surface, an $Al_2O_3$ layer was formed to a thickness of 12 nm as an insulating layer 106. The $Al_2O_3$ layer was formed by ALD. A gate electrode 302 was formed on the insulating layer 106 in the gate electrode forming region. The insulating layer 106 in the region in which the source electrode 304 and the drain electrode 306 are to be formed was removed, thereby forming the source electrode 304 and the drain electrode 306. The source electrode 304 and the drain electrode 306 were formed to sandwich the gate electrode 302 therebetween, so that they are respectively electrically connected to the channel under the gate electrode 302. The gate electrode 302 was formed by forming the laminated film of Ti/Pt/Au by vacuum evaporation, and patterning the laminated film by a lift-off technique. The source electrode 304 and the drain electrode 306 were formed by forming the laminated film of AuGe/Ni/Au by vacuum evaporation, and patterning the laminated film by a lift-off technique.

Figure 14:
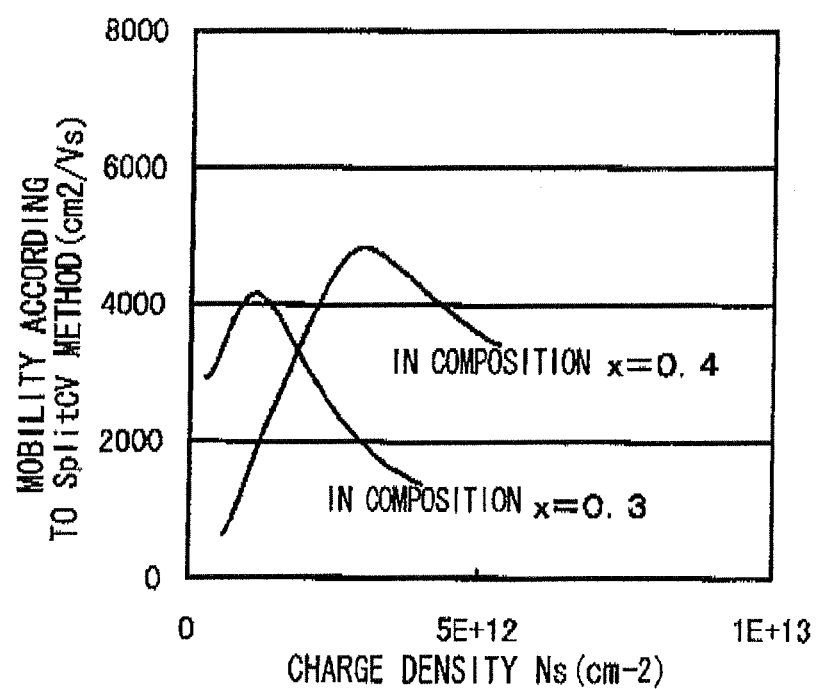
FIG. 14 shows an experimental graph resulting from measuring the relation between the carrier mobility and the charge density of the insulated gate field effect transistor 560 using SplitCV.
Figure 15:
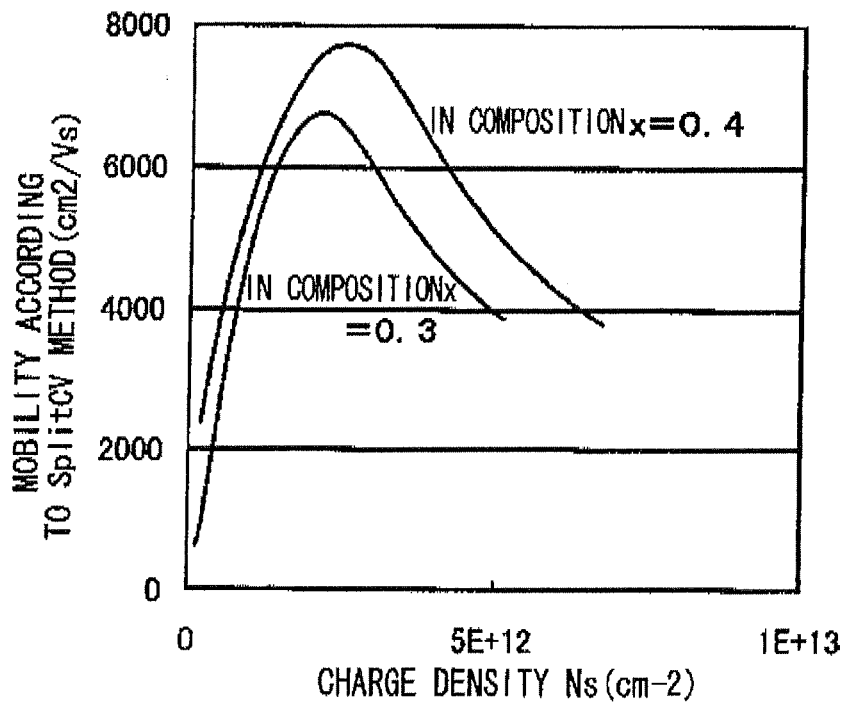
FIG. 15 shows an experimental graph resulting from measuring the relation between the carrier mobility and the charge density of another insulated gate field effect transistor using SplitCV.

FIG. 14 and FIG. 15 respectively show an experimental graph drawing the experimental result of measuring the relation between the carrier mobility and the charge density of the insulated gate field effect transistor 560 using SplitCV. The only difference therebetween was that in the insulated gate field effect transistor in FIG. 15, a 10 nm etching stopper layer 218 (n-type $In_{0.48}Ga_{0.52}P$ layer) was left remaining between the non-doped layer 216 and the insulating layer 106 in the gate region of the insulated gate field effect transistor 560. The drawings respectively show the example in which In composition x is 0.3. The example utilizes the insulated gate field effect transistor 300. SplitCV is to calculate the charge amount of the channel from the capacity obtained by CV measurement of MOSFET, and to calculate the carrier mobility using the analytic method based on gradual channel approximation. The mobility obtained by SplitCV is affected by the charge trapped in the interface states, and so is known to tend to yield an underestimated value compared to the mobility obtained through a Hall measurement method (i.e. Van der Pauw method). The gate length used in the insulated gate field effect transistor in the experiments regarding FIG. 14 and FIG. 15 was 100 μm, and the gate width was 200 μm. The drain voltage at the measurement was 0.05 V, and the gate voltage was varied in the range of −2 to +2 V, with a step width of 0.05 V.

When the In composition x was 0.4 in the first crystalline layer 104, in the structure in which a gate insulating layer 106 was formed on the AlGaAs layer of the non-doped layer 216 of FIG. 14, the maximum mobility was 4800 $cm^{-2}/Vs$, whereas in the structure in which a gate insulating layer 106 was formed on the n-type InGaP layer of the etching stopper layer 218 of FIG. 15, the maximum mobility obtained was 7700 $cm^{-2}/Vs$ which is high. The same tendency was also observed in the examples in which the In composition x was 0.3 in the first crystalline layer 104. This difference in SplitCv mobility is attributed to the difference in the semiconductor layers that are in contact with the gate insulating layer 106. To be more specific, when the semiconductor forming the MOS interface that is in contact with the gate insulating layer 106 is made of an InGaP layer, the MOS interface obtained will have a high SplitCV mobility, compared to such cases as the semiconductor being a GaAs layer or an AlGaAs layer. In other words, the MOS structure in which the gate insulating layer 106 is in direct contact with the InGaP layer will have a favorable mobility characteristic in the insulated gate field effect transistor.

A still different embodiment example is explained as follows. Table 3 shows a layer configuration of the semiconductor wafer 600 which is another embodiment example of the present invention. Just as in the case of the semiconductor wafer 400, each layer of Table 3 was formed on the GaAs wafer in the order starting from the smaller reference numbers, thereby creating the semiconductor wafer 600. The semiconductor wafer 600 is used for an N-channel-type field effect transistor.

TABLE 3

| NO. | STRUCTURE | FILM THICKNESS (nm) | DOPING CONCENTRATION $\times 10^{18}$ ($cm^{-3}$) |
|---|---|---|---|
| 616 | $Al_2O_3$ | 12 | — |
| 614 | p-$Al_{0.24}Ga_{0.76}As$ | 4 | 0.5~16 |
| 612 | i-$Al_{0.24}Ga_{0.76}As$ | 6 | — |
| 610 | i-GaAs | 2 | — |
| 608 | i-$In_{0.3}Ga_{0.7}As$ | 7.5 | — |
| 606 | i-GaAs | 2 | — |
| 604 | i-$Al_{0.24}Ga_{0.76}As$ | 2 | — |
| 602 | n-$Al_{0.24}Ga_{0.76}As$ | 4 | 1.23~11.2 |
| 402 | i-GaAs/i-$Al_{0.25}Ga_{0.76}As$ LAYER STRUCTURE | 500 | — |

The layer 602 is an n-type $Al_{0.24}Ga_{0.6}As$ layer having a thickness of 4 nm. The doping concentration of the donor atom was adjusted so that the threshold voltage of the field effect transistor becomes 0.2 V. The doping concentration of the donor atom was adjusted to lie in the range of $1.2 \times 10^{18}$ $cm^{-3}$ to $1.1 \times 10^{19}$ $cm^{-3}$, depending on the doping concentration of the acceptor atom to the layer 616. Table 4 shows the correspondence between the p-type doping concentration to the layer 616 and the n-type doping concentration to the layer 602. The layer 604 is a non-doped $Al_{0.24}Ga_{0.76}As$ layer having a thickness of 2 nm. The layer 606 is a non-doped GaAs layer having a thickness of 2 nm. The layer 608 is a non-doped $In_{0.3}Ga_{0.7}As$ layer having a thickness of 7.5 nm. The layer 610 is a non-doped GaAs layer having a thickness of 2 nm. The layer 612 is a non-doped $Al_{0.24}Ga_{0.76}As$ layer having a thickness of 6 nm. The layer 614 is a p-type $Al_{0.24}Ga_{0.76}As$ layer having a thickness of 4 nm. The doping concentration of the acceptor atom was adjusted to $5 \times 10^{17}$ $cm^{-3}$ to $1.6 \times 10^{19}$ $cm^{-3}$, and in the range of $2 \times 10^{11}$ $cm^{-2}$ to $6.4 \times 10^{12}$ $cm^{-2}$ in terms of sheet concentration. The layer 616 is an insulating layer ($Al_2O_3$) having a thickness of 12 nm. The specific permittivity of the insulating layer was set to 7. The layer 602 is an example of the third crystal line layer, and the layer 608 is an example of the first crystalline layer 104. The layer 614 is an example of the second crystalline layer 108, and the layer 616 is an example of the insulating layer 106. The layer 402 is set to be the same as the layer 402 in the semiconductor wafer 400.

TABLE 4

| P-TYPE DOPING CONCENTRATION OF LAYER 614 ($cm^{-3}$) | N-TYPE DOPING CONCENTRATION OF LAYER 602 ($cm^{-3}$) |
|---|---|
| $5.00 \times 10^{17}$ | $1.231 \times 10^{18}$ |
| $1.00 \times 10^{18}$ | $1.587 \times 10^{18}$ |
| $4.00 \times 10^{18}$ | $3.470 \times 10^{18}$ |
| $8.00 \times 10^{18}$ | $6.009 \times 10^{18}$ |
| $1.20 \times 10^{19}$ | $8.500 \times 10^{18}$ |
| $1.60 \times 10^{19}$ | $1.115 \times 10^{19}$ |

Figure 16:
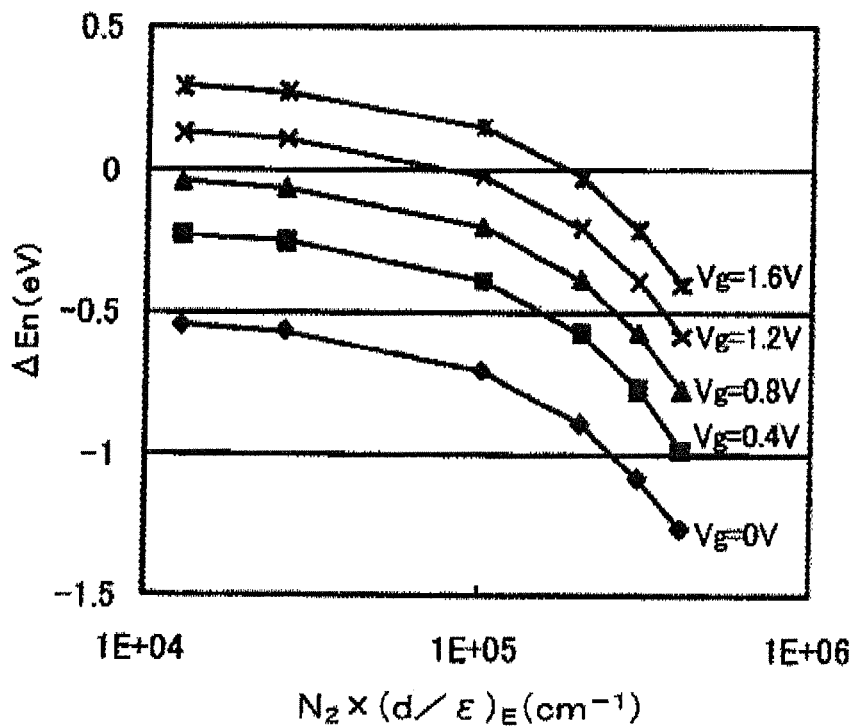
FIG. 16 shows a plot of a calculated value of the Fermi level at the MOS interface of the semiconductor wafer 600 when the impurity concentration of the layer 614 was changed.

FIG. 16 shows a plot of a calculated value of the Fermi level at the MOS interface of the semiconductor wafer 600 when the impurity concentration of the layer 614 was changed. The calculation conditions were set the same as in the case of FIG. 10. The vertical axis shows ΔEn (Fermi level with reference to the lower edge of the conduction band), and the horizontal axis represents the value $N_2 \times (d/\in)_E$. Note that the $N_2$ represents the sheet concentration of the acceptor atom included in the layer 614. $(d/\in)_E$ represents an effective electric film thickness explained above for each of the layer 616 being an insulating layer and the layer 614 through the layer 608. The drawing shows the result obtained by varying the gate voltage Vg in the range of 0 V and 1.6 V. In each gate voltage, there has been observed noticeable shift in the value of ΔEn when the value of $N_2 \times (d/\in)_E$ exceeds $1 \times 10^5$ (cm$^{-1}$). As the value of ΔEn decreases, the Fermi level at the MOS interface will be closer to the charge neutrality level. Therefore, it is considered favorable to have the value of $N_2 \times (d/\in)_E$ to exceed $1 \times 10^5$ (cm$^{-1}$). Note that the condition under which the value $N_2 \times (d/\in)_E$ exceeds $1 \times 10^5$ (cm$^{-1}$) is roughly $N_2 > 1 \times 10^{12}$ (cm$^{-2}$). This means that it is preferable that the sheet concentration $N_2$ of the impurity atom included in the layer 614 satisfies the expression $N_2 > 1 \times 10^{12}$ (cm$^{-2}$).

Figure 17:
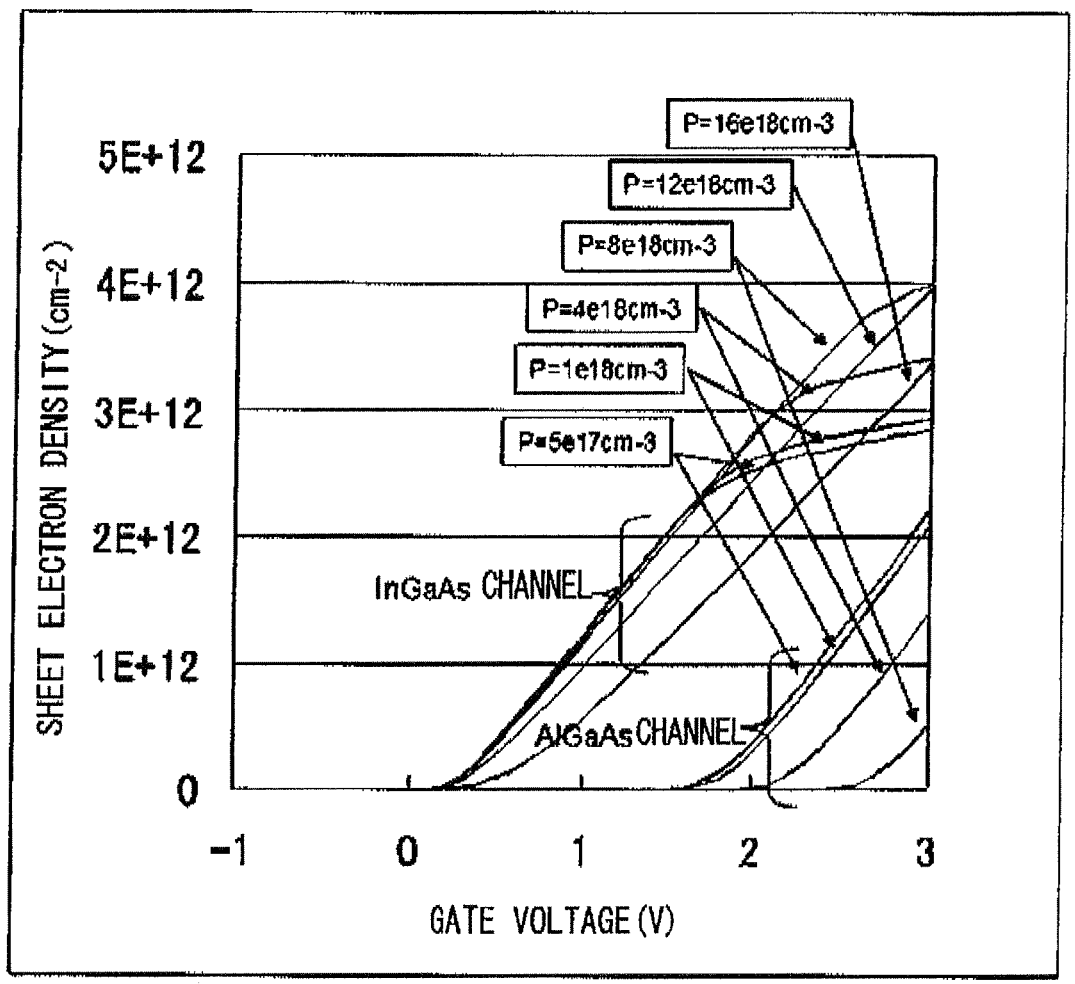
FIG. 17 shows a plot of the calculated value of the sheet electron density in a channel in relation to the gate voltage, when the semiconductor wafer 600 constitutes the MOS structure.

FIG. 17 shows a plot of the calculated value of the sheet electron density in a channel in relation to the gate voltage, when the semiconductor wafer 600 is constituted in the MOS structure. Each calculated value was obtained by varying the impurity concentration of the layer 614. Each condition used in the calculation was the same as in the case of FIG. 16. The impurity concentration of the layer 614 is depicted in the drawing. The vertical axis represents the sheet electron density in the channel having the MOS structure, and the horizontal axis represents the gate voltage. Just as in FIG. 8, the sheet electron density of the "InGaAs channel" of the first channel starts to rise up when the gate voltage is at around 0.2 V, and continues to increase as the gate voltage is raised. When the gate voltage is further increased, the sheet electron density of the "AlGaAs channel" of the second channel starts to increase, causing so-called "Spillover." When the sheet electron density of the "AlGaAs channel" of the second channel starts to rise up with respect to the gate voltage just as in the case of FIG. 8, the change of the sheet electron density of the "InGaAs channel" of the first channel decreases. Such a phenomenon is hereafter referred to as "saturation" of the electron concentration.

Just as the "GaAs channel" in FIG. 8, the "AlGaAs channel" is a parasite channel formed around the p-$Al_{0.24}Ga_{0.76}As$ layer which is the layer 614 that underlies the gate insulating film. In the insulated gate field effect transistor of the present invention, the transistor channel uses semiconductor heterojunction, in which mainly the InGaAs channel performs conduction, with the AlGaAs channel functioning as a parasitic channel in many cases. In other words, the sheet electron density of the "InGaAs channel" is desirably high at the gate voltage at which the sheet electron density of the "AlGaAs channel" of the second channel starts to rise up (i.e., it is desirable to restrain "spillover.")

As the acceptor impurity concentration increases in the layer 614, the gate voltage at which the sheet electron density of the "AlGaAs channel" starts to increase sharply is shifted towards the positive side. At the same time, the sheet electron density at which the change of the sheet electron density of the "InGaAs channel" of the first channel starts to be decreased increases. Generally, in the field effect transistors, the electron mobility of the second channel is much lower than the electron mobility in the first channel. Those means the transconductance is maintained up to the high current.

Figure 18:
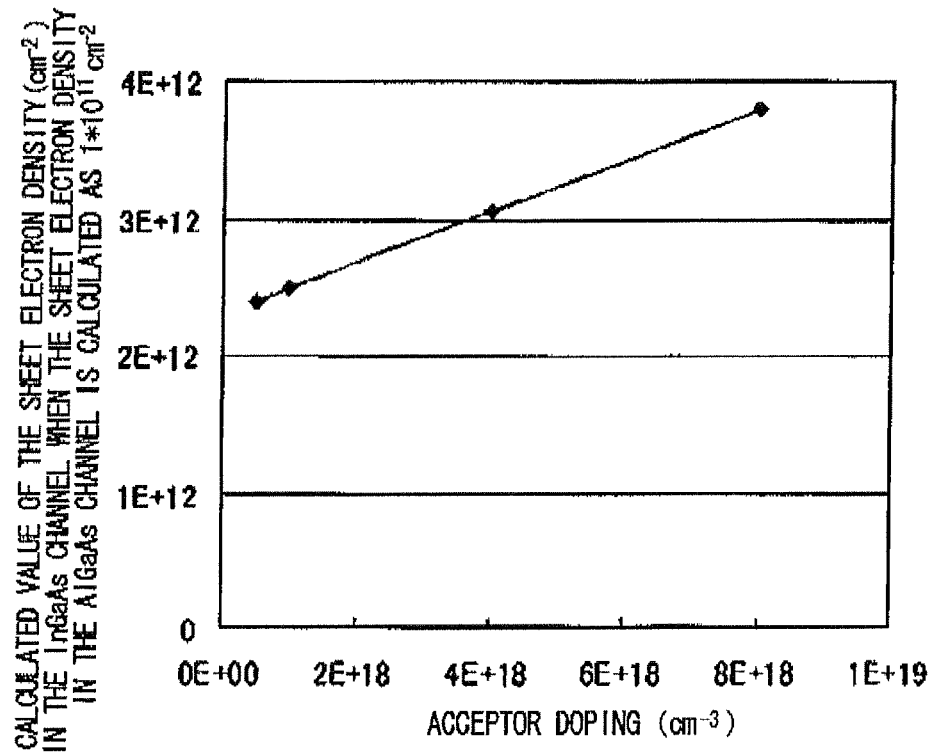
FIG. 18 shows a plot of the calculated value of the sheet electron density in the first channel's "InGaAs channel" in relation to the acceptor sheet concentration, when the sheet electron density in the second channel's "AlGaAs channel" of FIG. 17 is $1 \times 10^{11}$ cm$^{-2}$.

FIG. 18 shows a plot of the calculated value of the sheet electron density in the first channel's "InGaAs channel" in relation to the acceptor sheet concentration, of the layer 614 when the sheet electron density in the second channel's "AlGaAs channel" is calculated as $1 \times 10^{11}$ cm$^{-2}$ as in the similar calculation to the one used in FIG. 17. It is shown that as the increase in acceptor concentration of the layer 614, the sheet electron density of the first channel's "InGaAs channel" increases when the sheet electron density of the second channel's "AlGaAs channel" substantially becomes $1 \times 10^{11}$ cm$^{-2}$. This shows that it is preferable for the transistor wafer to include as many acceptors as possible in the layer 614.

This further means that in the insulated gate field effect transistor wafer of the present invention, the inclusion of the acceptor in the layer 614 helps raise the potential at the MOS interface during the transistor operation, as well as reduce the effect of the interface states. It also helps restrain generation of the parasite channel, and increase the operational current of the transistor.

As you can see from FIG. 17, the amount of change in the sheet electron density for the first channel's "InGaAs channel" with respect to the gate voltage(dNs/dVg) declines in the structure in which the acceptor density p of the layer 614 is $1.2 \times 10^{19}$ cm$^{-3}$, $1.6 \times 10^{19}$ cm$^{-3}$. Since there is no reduction seen in dNs/dVg when the acceptor density p of the layer 614 is $8 \times 10^{18}$ cm$^{-3}$, the preferable value for the acceptor density p of the layer 614 can be estimated as around $8 \times 10^{18}$ cm$^{-3}$ in the layer structure of Table 3. The main cause for decline of the amount of change in electron concentration due to the high acceptor concentration of this layer 614 is that the average position of the electron in the first channel's "InGaAs channel" shifts a little bit towards the wafer side due to the increase in electric fields formed with the acceptor density in the layer 614. Furthermore, the worsening in the initial increase of the electron concentration in the "InGaAs channel" can be attributed to the fact that the lowering of the potential of the n-$Al_{0.24}Ga_{0.76}As$ which is the n-type impurity doped layer of the layer 602 that underlies the channel moved the carrier further towards the wafer side. In the practical semiconductor wafer design, the required device performance should be taken into consideration to design these factors adequately.

Figure 19:
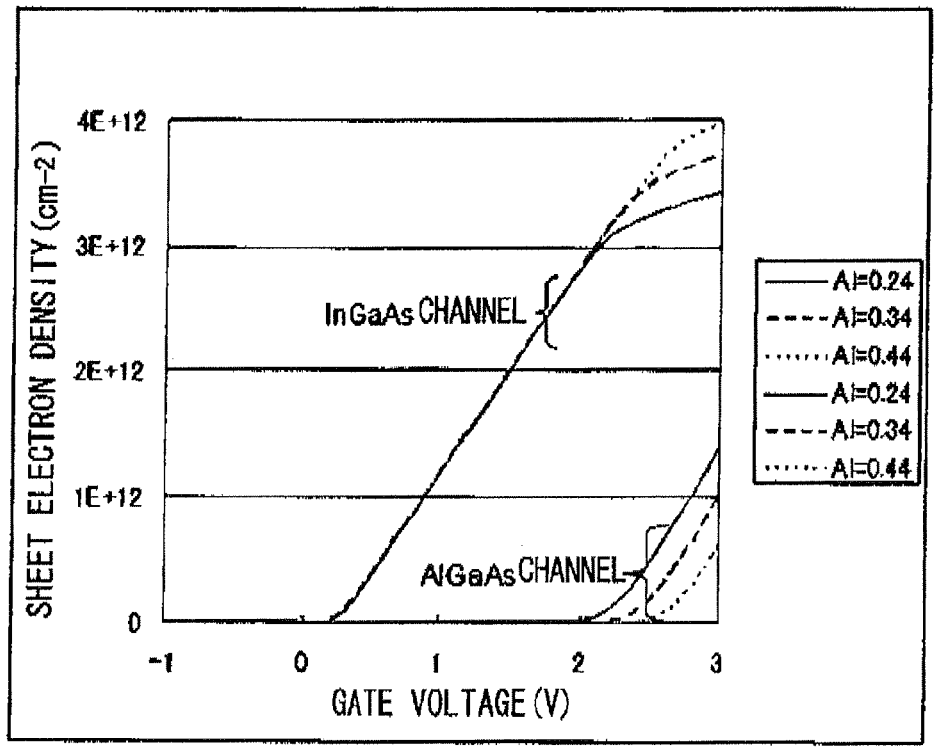
FIG. 19 shows a plot of the calculated value of the sheet electron density in a channel having a MOS structure in relation to the gate voltage, when the Al composition of the layer 614 was varied.

FIG. 19 shows a plot of the calculated value of the sheet electron density in a channel of the MOS structure in relation to the gate voltage, when the Al composition of the layer 614 was changed. Each condition for the calculation was set the same as in the case of FIG. 17, except that the impurity concentration of the p-type $Al_{0.24}Ga_{0.76}As$ layer of the layer 614 and the n-type $Al_{0.24}Ga_{0.76}As$ layer of the layer 602 were set as $4 \times 10^{18}$ cm$^{-3}$, $3.47 \times 10^{18}$ cm$^{-3}$, respectively. And the Al composition of the AlGaAs layer for the layer 614 and the layer 612 was changed as 0.24, 0.34, and 0.44.

As the Al composition increases, the gate voltage at which the electron density in "AlGaAs channel" of the second channel which is the parasite channel goes up is shifted to the positive side, and also the electron density at which the amount of change of the electron density of the first channel's "InGaAs channel" starts to decrease will increase. In other words, by heightening the Al composition in the AlGaAs layer for the layer 614 and the layer 612, the parasite channel is restrained, and as a result, the electron density in the "InGaAs channel" of the first channel can be increased, which is preferable to the insulated gate field effect transistor.

Figure 20:
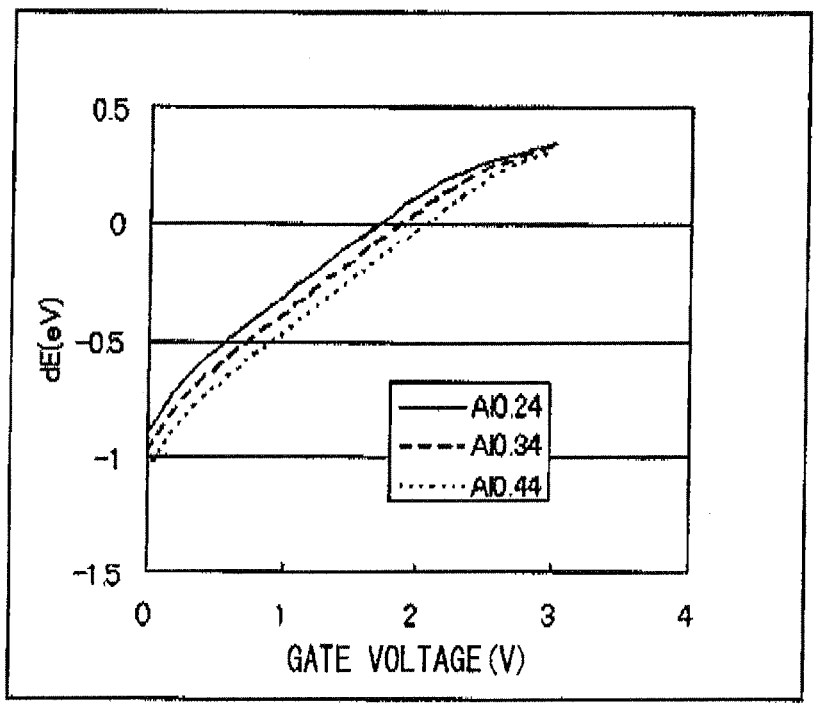
FIG. 20 shows a plot of the calculated value of the Fermi level at the MOS interface in relation to the gate voltage, when the Al composition of the layer 614 was varied.

FIG. 20 shows a plot of the calculated value of the Fermi level at the MOS interface in relation to the gate voltage, when the Al composition of the layer 614 was changed. By changing the gate voltage similar as in FIG. 11 in the structure of the semiconductor wafer calculated in FIG. 19, the energy difference between the Fermi level at the MOS interface and the lower edge of the conduction band of the AlGaAs layer which is the layer 614 is calculated. Each condition adopted was the same as in FIG. 19. By increasing the Al composition of the AlGaAs layer which is the layer 614, the Fermi level at the MOS interface decreases relative to the lower edge level of the conduction band of the AlGaAs layer. This suggests gate voltage dependency of the electron concentration of the first channel's "InGaAs channel" as shown in FIG. 19.

Figure 21:
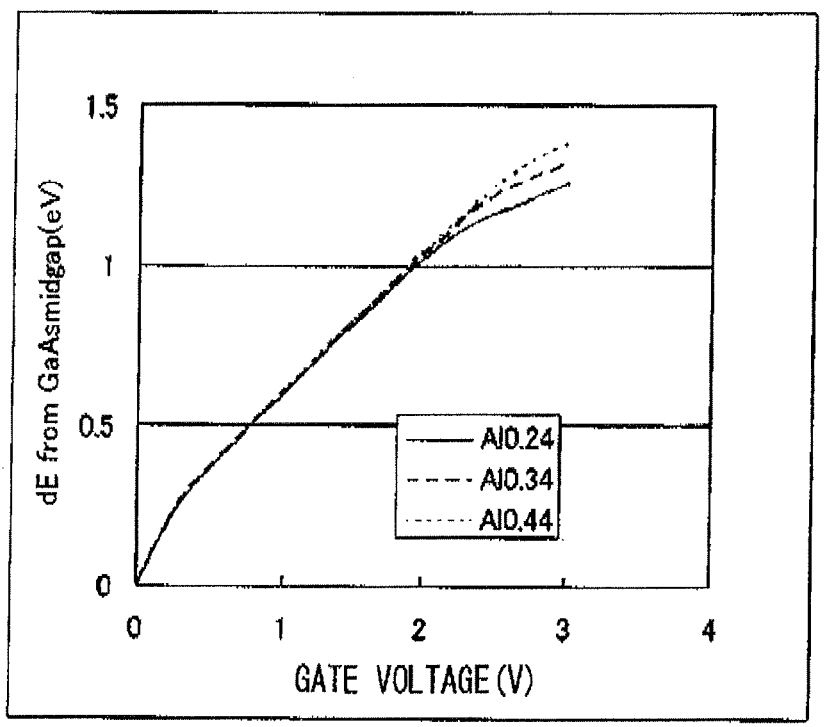
FIG. 21 shows a plot of the calculated value of the Fermi level with respect to the GaAs layer converted mid-gap level of the AlGaAs layer at the MOS interface, in relation to the gate voltage, when the Al composition of the layer 614 was varied.

FIG. 21 shows a plot of the calculated value of the Fermi level at the MOS interface with respect to the GaAs layer converted mid-gap level of the AlGaAs layer, in relation to the gate voltage, when the Al composition of the layer 614 was changed. In FIG. 21, the energy of the Fermi level at the MOS interface calculated in FIG. 20 is plotted with reference to the band gap center energy level of the GaAs layer when the GaAs layer made a junction with the AlGaAs layer on the MOS interface. No difference is observed in Fermi level due to the Al composition increase with reference to the band gap center energy level of the GaAs layer when the GaAs makes a junction. Although the specific regarding the MOS interface characteristic, such as the charge neutrality level of the MOS interface of the AlGaAs layer or the energy dependency of the interface state density, is not well known, the increase of the Al composition in the AlGaAs layer seems less effective for making the Fermi level at the MOS interface lower and making it closer to the charge neutrality level during the transistor operation. For attaining a more favorable insulated gate field effect transistor wafer, what is more effective is to dope an acceptor impurity into AlGaAs which is proposed in the present invention (i.e, to combine with the formation of the negative fixed space charge), in addition to increasing the Al composition of the AlGaAs layer. From the above, it is contemplated to be preferable to form the band gap of the second crystalline layer equal to or larger than the band gap of the third crystalline layer and the fourth crystalline layer.

As explained above, when the field effect transistor is of an N-channel type, for example, creation of a preferable wafer for an insulated gate field effect transistor can be realized if the potential of the MOS interface is raised high with respect to the electron by forming a negative fixed space charge in a region near the gate insulating layer between the gate insulating layer 106 and the first crystalline layer 104 which is the channel layer. The negative fixed space charge can be formed by doping a second atom (which will be a so-called acceptor) that can be sufficiently activated in room temperature. Here, the first atom should doped into the third crystalline layer 110 that functions as a donor. It is preferable to dope the donor atom near the channel layer. For setting the threshold voltage of the transistor to a targeted value, the sheet concentration $N_1$ for the first atom is set according to the sheet concentration $N_2$ of the aforementioned second atom.

Figure 22:
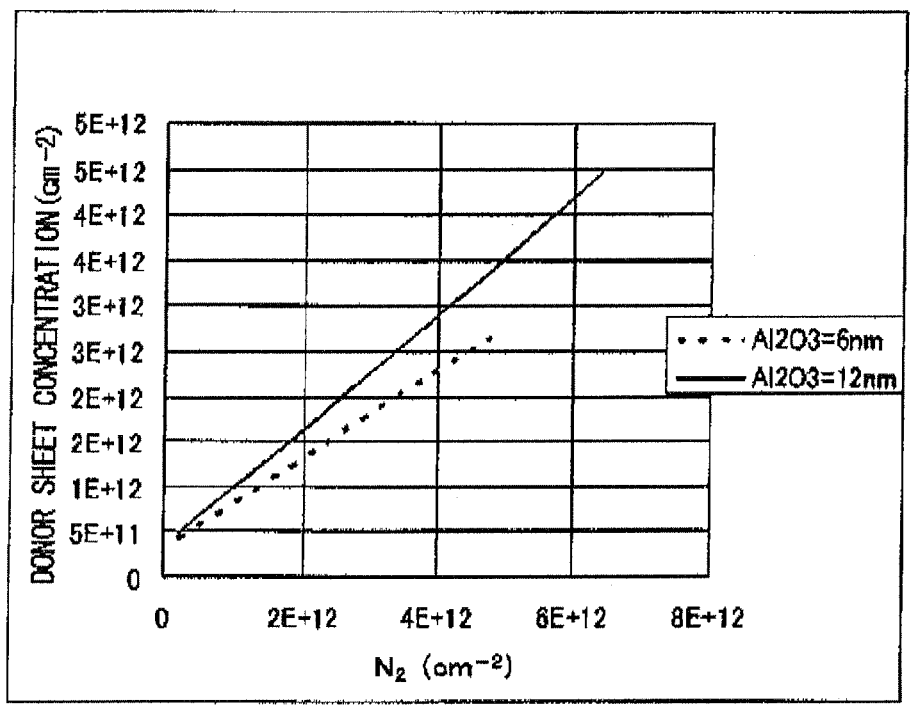
FIG. 22 shows a plot of the relation between the donor sheet concentration $N_1$ and the acceptor sheet concentration $N_2$, which is obtained by converting the doping amount of Table 4 into a sheet concentration.

FIG. 22 shows a plot of the relation between the donor sheet concentration $N_1$ and the acceptor sheet concentration $N_2$, which is obtained by converting the doping amount of Table 4 into a sheet concentration. The threshold voltage Vt for the field effect transistor was set to a constant value of 0.2 V. The donor sheet concentration $N_1$ when the thickness of the insulating layer 106 is 6 nm is also calculated and plotted. Under the constant Vt, the donor sheet concentration $N_1$ will increase almost as a straight line with respect to the acceptor sheet concentration $N_2$. The approximation of the ratio $dN_1/dN_2$ of the donor sheet concentration $N_1$ increase to the $N_2$ increase is estimated as the following Expression 7.

$$SF = \frac{\left(\frac{d}{\varepsilon}\right)_1 + \left(\frac{d}{\varepsilon}\right)_2}{\left(\frac{d}{\varepsilon}\right)_1 + \left(\frac{d}{\varepsilon}\right)_2 + \left(\frac{d}{\varepsilon}\right)_3} \qquad \text{EXPRESSION 7}$$

As Table 5 indicates, the actual comparison shows that $dN_1/dN_2$ in FIG. 22 matches well the value of Expression 7.

TABLE 5

| $Al_2O_3$ THICKNESS (nm) | $dN_1/dN_2$ | SF |
|---|---|---|
| 6 | 0.488 | 0.487 |
| 12 | 0.635 | 0.637 |

When the value of Expression 7 is referred to as "structural factor SF" representing the layer structure of the field effect transistor, the donor sheet concentration $N_1$ when the threshold voltage Vt of the field effect transistor is constant will be approximated as $N_1 = N_0 +$ Structural Factor $SF \times N_2$ [cm$^{-2}$]. $N_0$ represents the sheet concentration of the first atom when the threshold voltage of the field effect transistor becomes the set value Vt when there is no second atom doped into the second crystalline layer.

Here, although being an approximation of $dN_1/dN_2$, the SF can assure a sufficient level of accuracy as shown in Table 5, and therefore the actual value of $dN_1/dN_2$ will lie in the range of $1 \pm 0.1$ times SF. Therefore, by following the expression $N_0 + SF \times 0.9 \times N_2 < N_1 < N_0 + SF \times 1.1 \times N_2$ [cm$^{-2}$], the structure of a wafer for a transistor can be prepared that can achieve an object of the present invention.

The further deliberation has revealed that in the structure of Table 3, $N_0$ is given by Expression 5 when the field effect transistor is of an N-channel-type, and when the field effect transistor is of a P-channel-type, $N_0$ is given by Expression 6.

$$N_0 = \frac{W - Cf - Vt}{\left(\frac{d}{\varepsilon}\right)_1 + \left(\frac{d}{\varepsilon}\right)_2 + \left(\frac{d}{\varepsilon}\right)_3} \times \frac{\varepsilon_0}{q} + Const \qquad \text{EXPRESSION 5}$$

$$-N_0 = \frac{W - Cf - Vt}{\left(\frac{d}{\varepsilon}\right)_1 + \left(\frac{d}{\varepsilon}\right)_2 + \left(\frac{d}{\varepsilon}\right)_3} \times \frac{\varepsilon_0}{q} - Const \qquad \text{EXPRESSION 6}$$

Note that W[V] is the work function of the gate electrode of the field effect transistor, and Vt[V] represents the threshold voltage of the field effect transistor. Cf[V] is a corrected value of the channel material's physical property, which concretely corresponds to the difference between the Fermi level and the vacuum level at the channel position when the gate voltage of the field effect transistor is Vt. When the field effect transistor is of an N-channel-type, Cf substantially matches the electron affinity. When the channel of the field effect transistor is a quantum well, Cf substantially matches the potential from the ground level to the vacuum level. When the field effect transistor is of a P-channel-type, Cf will be a potential difference substantially equaling the ionized potential. Cf will differ as the composition of the crystalline layer changes.

Cf may include a potential difference in the gate insulating layer that would occur due to the space charge formed by the interface states between the gate insulating layer and the semiconductor layer. Specifically, the corrected value Cf may include a potential difference in the gate insulating layer in the state in which the gate electrode is biased to the threshold voltage of the field effect transistor. Such a potential difference is generated doe to the space charge formed by the interface states between the gate insulating layer and the semiconductor layer. The following is a consideration about the effect of the interface state density of the gate insulating layer on the value $N_0$.

The present invention can help adjust the position of the Fermi level at the MOS interface while the field effect transistor is in operation. While the field effect transistor is in operation, it is preferable to have the Fermi level at the MOS interface to be close to the charge neutrality level. When the Fermi level at the MOS interface equals the charge neutral level, the effect of the space charge on the interface states at the MOS interface will be zero. In the case of the field effect transistor is of an N-channel type, the Fermi level at the MOS interface will be shifted towards the lower edge of the conduction band of the semiconductor on the MOS interface when the gate voltage is shifted to a positive side from the threshold voltage Vt and the current is increased. Therefore, when the gate voltage is at the threshold voltage Vt, it is desirable to set the Fermi level at the MOS interface close to the charge neutrality level or further towards the upper edge of the valance hand.

Here, the assumption is made such that the Fermi level at the MOS interface when the gate voltage is at the threshold voltage Vt is set towards the upper edge side of the balance band by 0.3 eV from the charge neutrality level. The interface state density realistic for actual applications is equal to or below about $3\times10^{11}$ cm$^{-2}$. With this value, the effect to the $N_0$ formed on the MOS interface is reduced by about $4\times10^{10}$ cm$^{-2}$. In the case of the P-channel-type, the effect to $N_0$ will also be in the decline just as in the case of the N-channel-type, although the energy level shift direction will be reversed.

Where Eg is the band gap of the semiconductor at the MOS interface, for the N-channel-type, it is preferable to adopt about the range of +Eg/8 to −Eg/3 as the value of the difference between the charge neutrality level and the Fermi level at the MOS interface when the gate voltage is set to threshold voltage Vt. A further preferable range would be 0 to −Eg/4. When the sign is negative, it indicates the upper edge side of the valance band, and when the sign is positive, it indicates the lower edge side of the conduction band. In the case of the P-channel-type, it is preferable to set so that the Fermi level will be on the lower edge side of the conduction band, just as in the case of the N-channel-type. The charge neutrality level may be replaced with "the center level of the band gap".

Const[atoms/cm$^2$], although being a constant, depends on the various setting conditions of the crystalline layers (e.g., the design condition of the buffer layer formed between the base wafer and the channel layer). Specifically, it corresponds to $N_1$ at which the threshold voltage Vt becomes W—Cf when no second atom is doped. Normally, a buffer layer is formed between the channel layer and the base wafer. By doping this buffer layer with a second atom, a depleted layer is formed near the channel side of the buffer layer, and an electric field is formed in the buffer layer to confine the channel carriers. Const corresponds to the sheet concentration of the first atom that cancels out this electric field. The concentration of the second atom doped into the buffer layer is adjusted to the concentration that would yield the value of Const to be about $4.7\times10^{11}$ (cm$^{-2}$) in normal cases. Since it is not desirable to reduce this electric field in the buffer layer, it is not desirable to reduce the concentration of the second atom to be incorporated into the buffer layer to ½ of the above-mentioned normal concentration or below. By increasing the concentration of the second atom, the electric field is strengthened, and a more shallow junction structure can be obtained, thereby making a thinner buffer layer. This helps restrain the short channel effect that tend to be caused while pursuing miniaturization. This also contributes to cost reduction by making thinner films. On the other hand, by increasing the second atom concentration of the buffer layer, there is a chance of occurrence a side gate effect, having a kink, and reducing the buffer layer breakdown voltage. Since the depleted layer of the current buffer layer is 500 nm or more, it is possible to reduce the thickness thereof to about ⅓. In such a case, the concentration of the second atom to be doped into the buffer layer will be 3 times the normal concentration. With this in view, Const is desirably $2.3\times10^{11}$ to $1.4\times10^{12}$ [cm$^{-2}$]. Note that when the buffer layer has been adequately designed, $N_0$ can be an experimentally determined value. In such a case, the sheet concentration $N_{0exp}$ of the first atom experimentally obtained can be $N_{0exp}=N_0=N_{0min}=N_{0max}$.

The still further deliberation has revealed that the expression $Cf=-1.69x^2+1.66x+4.33$ can be used for the approximation of Cf(v) under a condition that the first crystalline layer 104 that is the channel layer of the field effect transistor is $In_xGa_{1-x}As$ ($0.2 \le x < 0.45$) and pseudo lattice matches GaAs. Note that x represents the In composition of the channel.

The constant "Const" depends on the design or the buffer layer as stated above. The constant "Const" is a very crucial setting factor that is determined by conducting experimental optimization taking into account the various characteristics of the field electric transistor such as short-channel effect, pinch-off characteristic, drain-conductance, occurrence of a kink, side-gate effect, a residual gate capacitance at the electric-current OFF state, or the like. The buffer layer assumed in Table 3 has this constant Const to be about $4.7\times10^{11}$ (cm$^{-2}$). The constant Const preferably lie within the range of $2.3\times10^{11}$ to $1.4\times10^{12}$ (cm$^{-2}$) as stated above. Furthermore, the constant Const should have a certain magnitude from the perspective of pinch-off characteristics, and drain conductance. The occurrence of kink or the residual gate capacitance or the like restricts the upper limit of the constant Const too, and so the range of $3\times10^{11}$ to $1\times10^{12}$ (cm$^{-2}$) is preferable. Furthermore, from a long experience of epitaxial wafer production for p-HEMT, the constant Const in the range of $4\times10^{11}$ to $7\times10^{11}$ (cm$^{-2}$) has been found to be preferable.

Table 6 shows a layer configuration of the semiconductor wafer 700 that is a further different embodiment example of the present invention. Just as the semiconductor wafer 400, each layer shown in Table 5 was formed on the GaAs wafer in the order starting from the smaller reference numbers, thereby obtaining the semiconductor wafer 700. The semiconductor wafer 700 is used for an N-channel-type field effect transistor.

TABLE 6

| NO. | STRUCTURE | FILM THICKNESS (nm) | DOPING CONCENTRATION (cm$^{-3}$) |
|---|---|---|---|
| 724 | $Al_2O_3$ | 12 | — |
| 722 | i-$Al_{0.24}Ga_{0.76}As$ | 5 | — |
| 720 | p-$Al_{0.24}Ga_{0.76}As$ | 2 | $1.00 \times 10^{19}$ |
| 718 | i-$Al_{0.24}Ga_{0.76}As$ | 10 | — |
| 716 | n-$Al_{0.24}Ga_{0.76}As$ | 5 | $2.251 \times 10^{18}$ |
| 714 | i-$Al_{0.24}Ga_{0.76}As$ | 2 | — |
| 712 | i-GaAs | 2 | — |
| 710 | i-$In_{0.3}Ga_{0.7}As$ | 7.5 | — |
| 708 | i-GaAs | 2 | — |
| 706 | i-$Al_{0.24}Ga_{0.76}As$ | 2 | — |
| 704 | n-$Al_{0.24}Ga_{0.76}As$ | 5 | $1.125 \times 10^{18}$ |
| 402 | i-GaAs/i-$Al_{0.25}Ga_{0.75}As$ LAYER STRUCTURE | 500 | — |

The semiconductor wafer 700 has a layer configuration that includes a layer 716 that is an example of the fourth crystalline layer, in addition to the layer configuration of the semiconductor wafer 400 that includes a layer 410 that is an example of the first crystalline layer 104, a layer 416 that is an example of the second crystalline layer 108, and a layer 404 that is an example of the third crystalline layer.

The layer 402 is the same as the layer 402 of the semiconductor wafer 400. The layer 704 is an $Al_{0.24}Ga_{0.76}As$ layer having a thickness of 5 nm doped with a donor atom. The doping concentration of the donor atom is set to $1.125 \times 10^{18}$ $cm^{-3}$. The layer 704 is an example of the third crystalline layer.

The layer 706 and the layer 714 are a non-doped $Al_{0.24}Ga_{0.76}As$ layer having a thickness of 2 nm, and the layer 708 and the layer 712 are respectively a non-doped GaAs layer having a thickness of 2 nm. The layer 706, the layer 714, the layer 708, and the layer 712 can function as a spacer layer. The layer 710 is a non-doped $In_{0.3}Ga_{0.7}As$ layer having a thickness of 7.5 nm. The layer 710 is an example of the first crystalline layer 104.

The layer 716 is an $Al_{0.24}Ga_{0.76}As$ layer having a thickness of 5 nm doped with a donor atom. The doping concentration of the donor atom is set to $2.251 \times 10^{18}$ $cm^{-3}$. The layer 716 is an example of the fourth crystalline layer. The layer 716 is disposed between the layer 710 that corresponds to the first crystalline layer 104 and the layer 720 that corresponds to the second crystalline layer 108, and has a larger band gap than the layer 710 that corresponds to the first crystalline layer 104.

The layer 718 is a non-doped $Al_{0.24}Ga_{0.76}As$ layer having a thickness of 10 nm. The layer 720 is an $Al_{0.24}Ga_{0.76}As$ layer having a thickness of 2 nm into which an acceptor atom has been doped. The layer 720 is an example of the second crystalline layer 108. The doping concentration of the acceptor atom into the layer 720 is set to $1.0 \times 10^{19}$ $cm^{-3}$. The layer 722 is a non-doped $Al_{0.24}Ga_{0.76}As$ layer having a thickness of 5 nm. The layer 724 is an $Al_2O_3$ layer having a thickness of 12 nm. The layer 724 is an example of the insulating layer 106. The band gap energy of the layer 724 was set to 6.0 eV and the relative permittivity was set to 7.

By including the layer 716, excessively high doping concentration in the layer 704 corresponding to the third crystalline layer is prevented, and bending of the band near the layer 710 corresponding to the first crystalline layer 104 can be made closer to a symmetrical form. This prevents overflow of the carrier electron into the layer 704 that corresponds to the fourth crystalline layer, and prevents the characteristic deterioration of the field effect transistor.

When calculating the Fermi level at the MOS interface in the semiconductor wafer 700 when the gate voltage was changed, the Fermi level of the semiconductor wafer 750 (comparison example) and the semiconductor wafer 760 (another embodiment example) was also calculated in the similar manner. In the semiconductor wafer 750, a non-doped $Al_{0.24}Ga_{0.76}As$ layer of a thickness of 2 nm was selected as the layer 720 in Table 3. In addition, the doping concentration of the donor atom into the layer 716 was set to $6.00 \times 10^{17}$ $cm^{-3}$, the doping concentration of the donor atom into the layer 704 was set to $3.00 \times 10^{17}$ $cm^{-3}$, to adjust so that Vt will be 0.2 V. The semiconductor wafer 760 was designed to have a structure that does not include a non-doped $Al_{0.24}Ga_{0.76}As$ layer of a thickness of 5 nm which is the layer 722 in Table 3. Here, the doping concentration of the donor atom into the layer 716 was set to $2.120 \times 10^{18}$ $cm^{-3}$, and the doping concentration of the donor atom into the layer 704 was set to $1.060 \times 10^{18}$ $cm^{-3}$, to adjust so that Vt will be 0.2 V.

Figure 23:
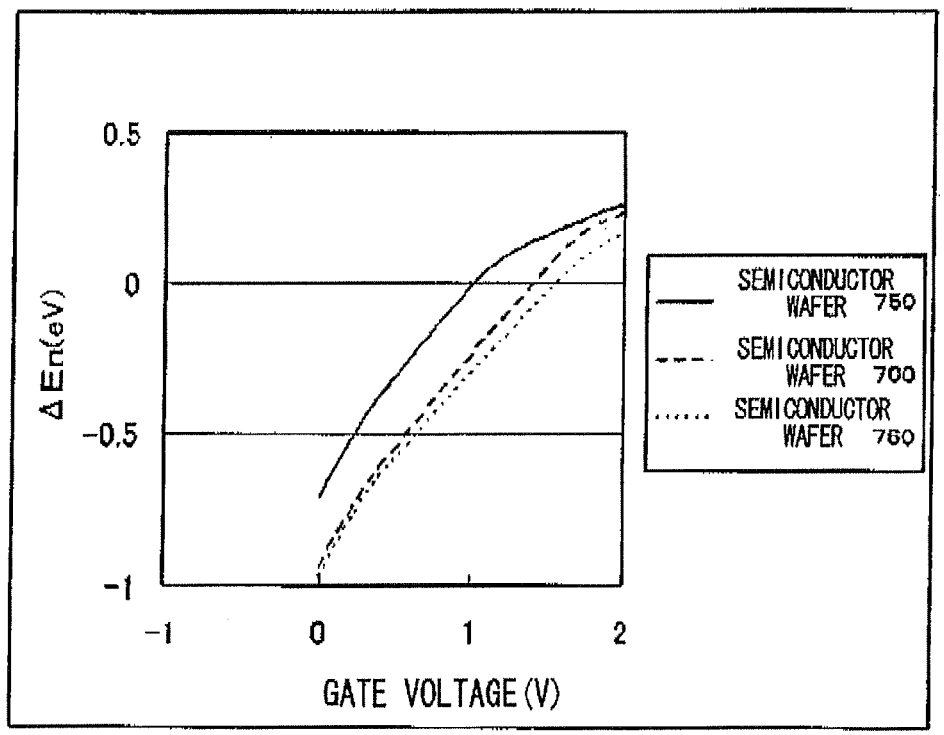
FIG. 23 shows a plot of the relation between the calculated value ΔEn (the value obtained by subtracting the Fermi level from the lower edge of conduction band at MOS interface) and gate voltage, in the case of the semiconductor wafers 700, 750, 760.

FIG. 23 shows a plot of the relation between the gate voltage and the calculated value ΔEn of the Fermi level at the MOS interface with respect to the lower edge of conduction band of the semiconductor wafers 700, 750, 760. The semiconductor wafer 700 results by adding the fourth crystalline layer including the first atom to be a donor, to the layer structure of the semiconductor wafer 600. The calculation result is shown by a broken line in the drawing. The calculation result for the semiconductor wafer 750 in the comparison example that does not include a second crystalline layer containing the second atom that will be an acceptor is shown as a solid line in the drawing. As can be seen, the Fermi level ΔEn at the MOS interface is shifted more than 0.2 eV towards the negative side, by the second crystalline layer including the second atom that is to be an acceptor. The semiconductor wafer 760 corresponds to the semiconductor wafer 700 from which the layer 722 which is the non-doped $Al_{0.24}Ga_{0.76}As$ layer of a thickness of 5 nm is removed. The semiconductor wafer 760 has such a structure in which the second crystalline layer including the second atom to be an acceptor is directly formed on the layer 724 which functions as a gate insulating layer. The calculation result is shown by a dotted line in the drawing. The Fermi level ΔEn at the MOS interface is shifted further towards the negative side of the semiconductor wafer 700, and it is found that a larger effect can be obtained by forming the second crystalline layer including the second atom to be an acceptor near to the layer 724 that functions as a gate insulating layer. This can also be explained by the fact that the value $(d/\in)_2$ is smaller and the effective electric film thickness $(d/\in)_E$ is larger in Expression 5.

Figure 24:
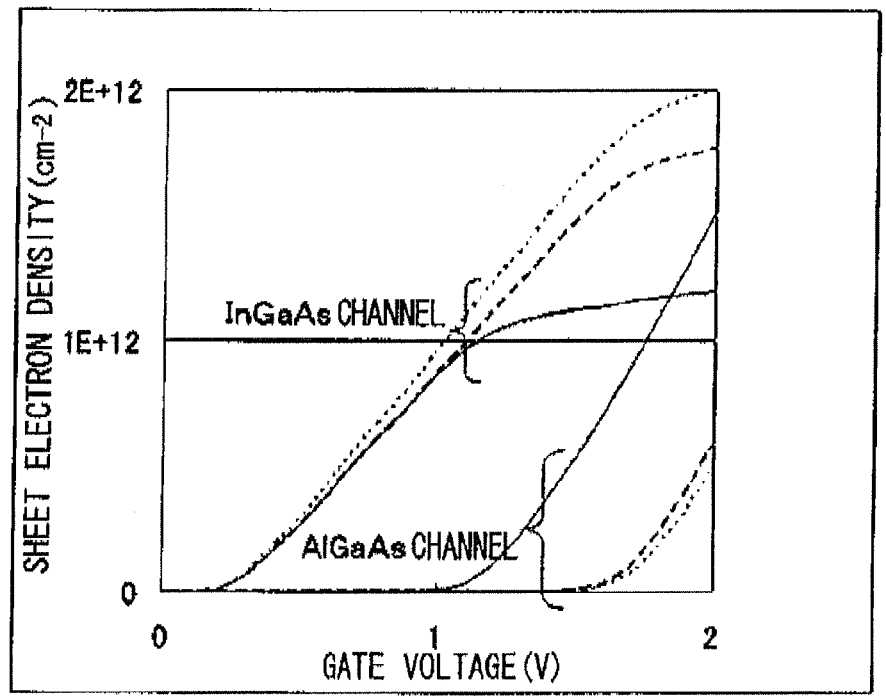
FIG. 24 shows a plot of the relation between the gate voltage and the calculated value of the sheet electron density of the channel of the MOS structure in the semiconductor wafers 700, 750, 760, respectively.

FIG. 24 shows a plot of the relation between the gate voltage and the calculated value of the sheet electron density of the channel on the MOS structure in the semiconductor wafers 700, 750, 760. The result for the semiconductor wafer 700 is shown as a broken line, the result for the semiconductor wafer 750 as a solid line, and the result for the semiconductor wafer 760 as a dotted line. The result of the semiconductor wafer 700 shows that the saturated concentration at which the change in electron concentration of the InGaAs channel becomes small with respect to the gate voltage Vg is higher than shown in the result of the semiconductor wafer 750, and the electron concentration of the AlGaAs channel is lower. This indicates that the semiconductor wafer 700 is suited as a wafer for a transistor. Furthermore, the result of the semiconductor wafer 760 indicates that the semiconductor wafer 760 is more suited as a wafer for a transistor than the semiconductor wafer 700.

Figure 25:
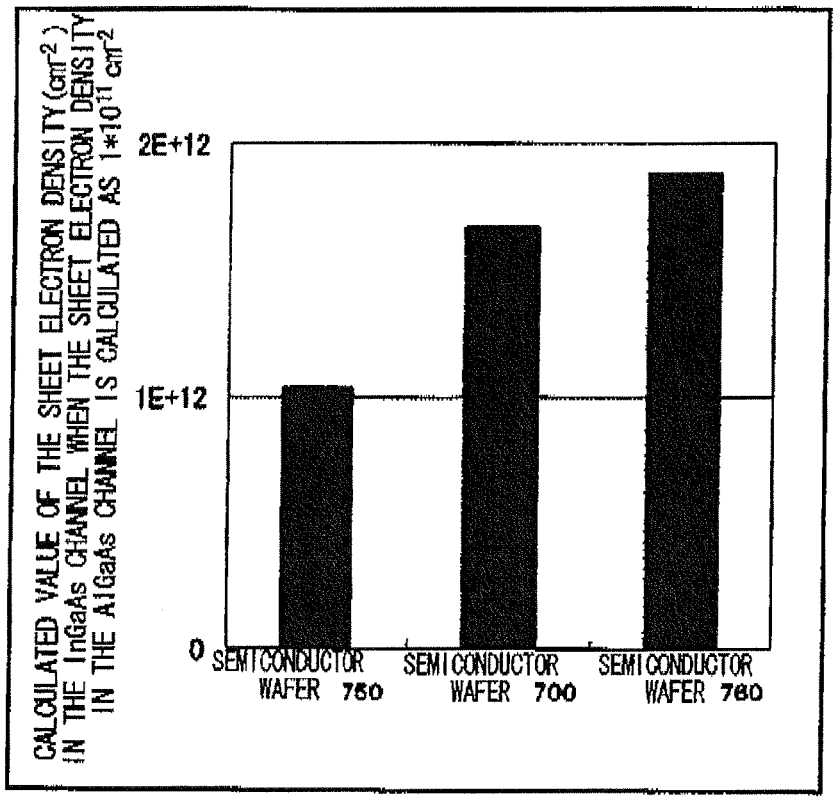
FIG. 25 shows a plot of the sheet electron density of the first channel's "InGaAs channel" when the sheet electron density of the second channel's "AlGaAs channel" of FIG. 24 is $1 \times 10^{11}$ cm$^{-2}$.

FIG. 25 shows a plot of the sheet electron density of the first channel's "InGaAs channel" when the sheet electron density of the second channel's "AlGaAs channel" of FIG. 24 is $1 \times 10^{11}$ $cm^{-2}$. The drawing shows that, by the effect of the second crystalline layer including the second atom to be an acceptor and the increase in the effective electric Film thickness by lowering of the value $(d/\in)_2$, the sheet electron density of the first channel's "InGaAs channel" that causes the sheet electron density of the second channel's "AlGaAs channel" becomes $1 \times 10^{11}$ $cm^{-2}$ is increased.

By the effect of the second crystalline layer including the second atom to be an acceptor the generation of the "AlGaAs channel," is restrained and the maximum electron concentration Ns at which the "saturation" phenomenon of the "InGaAs" channel occurs is increased. Furthermore, by decreasing the value $(d/\in)_2$, an effect of restraining the occurrence of "AlGaAs channel" has been observed. Furthermore, the change of the electron concentration Ns with respect to the gate voltage becomes larger. This is due to the improvement of the modulation efficiency due to decreased distance between the gate electrode and the channel by reduction in the value $(d/\in)_2$. This relates to the increase of transconductance Gm in the field effect transistor, which also shows a favorable effect.

FIG. 23, FIG. 24, FIG. 25 reveal that the layer configurations of the semiconductor wafer 700 and the semiconductor wafer 760 can also have a Fermi level at the MOS interface that is closer to the charge neutrality level, leading to reduction in adverse effect during the MOS operation due to the interface states. Note that by further increasing the sheet concentration $N_2$ of the second atom to be an acceptor included in the second crystalline layer, a Further enhanced effect can be expected.

As explained above, by disposing the second crystalline layer 108 which has a conductivity type opposite to the channel conductivity type, between the insulating layer 106 which is the gate insulating layer and the first crystalline layer 104 that is the channel layer, the MOS operation can be effected even by bringing the Fermi level at the MOS interface to be closer to the charge neutral level, and as a result the effect of the interface states on the MOS interface can be restrained. This helps enhance the carrier mobility in the first crystalline layer 104 as well as improving the performance of the insulated gate field effect transistor.

In the above-explained embodiment example, the field effect transistor is of an N-channel type. However, the same effect can be expected for a P-channel-type. However, when the field effect transistor is of a P-channel type, the layer 404, the layer 602, the layer 704, and the layer 716 include an atom that will be an acceptor, and the layer 416, the layer 614, and the layer 720 include an atom that will be a donor.

So far, the embodiments have been explained. However, the present invention is not limited to the above-explained embodiments, and various changes can be made thereto. For example, when the second crystalline layer 108 is $In_kGa_{1-k}P$ (0≤x≤1), the $In_kGa_{1-k}P$ (0≤x≤1) can include a natural superlattice. Here, the expression "an InGaP layer includes a natural superlattice" indicates that on a certain crystal plane formed by mixture between an In atom and a Ga atom, the InGaP layer includes a state in which a plane having a more In concentration than an average mixture ratio and a plane having a more Ga concentration than the average mixture ratio alternates. Furthermore, the ordering is referred to be high when the displacement is larger from the average mixture ratio in each plane. By including such a natural superlattice, a piezo charge is generated in the InGaP layer, and the same effect can be obtained as in the case of doping the atom to be an acceptor on the MOS interface side and doping the atom to be a donor on the channel side. Therefore, the effect of bringing the Fermi level at the MOS interface to be closer to the charge neutrality level can be further enhanced by the natural superlattice. Here, it is rather preferable if the field effect transistor is of an N-channel-type.

Each of Table 7, Table 8, Table 9, Table 10 shows a layer structure of the semiconductor wafer 910, 920, 930, 940 that is either another comparison example or an embodiment example of the present invention. Just as in the case of the semiconductor wafer 600, each layer shown in Table 7, Table 8, Table 9, and Table 10 is formed on the GaAs wafer in the order starting from the smaller reference numbers, thereby obtaining the semiconductor wafers 910, 920, 930, and 940. The semiconductor wafers 910, 920, 930, and 940 are used for an N-channel-type field effect transistor.

TABLE 7

| NO. | STRUCTURE | FILM THICKNESS (nm) | DOPING CONCENTRATION $\times 10^{18}$ (cm$^{-3}$) |
|---|---|---|---|
| 980 | $Al_2O_3$ | 12 | — |
| 968 | i-$In_{0.48}Ga_{0.52}P$ | 10 | — |
| 966 | n-$Al_{0.24}Ga_{0.76}As$ | 2 | x |
| 964 | i-$Al_{0.24}Ga_{0.76}As$ | 2 | — |
| 962 | i-GaAs | 2 | — |
| 960 | i-$In_{0.3}Ga_{0.7}As$ | 7.5 | — |
| 958 | i-GaAs | 2 | — |
| 956 | i-$Al_{0.24}Ga_{0.76}As$ | 2 | — |
| 954 | n-$Al_{0.24}Ga_{0.76}As$ | 2 | x |
| 952 | i-$Al_{0.24}Ga_{0.76}As$ | 6 | — |

TABLE 8

| NO. | STRUCTURE | FILM THICKNESS (nm) | DOPING CONCENTRATION $\times 10^{18}$ (cm$^{-3}$) |
|---|---|---|---|
| 980 | $Al_2O_3$ | 12 | — |
| 970 | o-$In_{0.48}Ga_{0.52}P$ | 10 | — |
| 966 | n-$Al_{0.24}Ga_{0.76}As$ | 2 | x |
| 964 | i-$Al_{0.24}Ga_{0.76}As$ | 2 | — |
| 962 | i-GaAs | 2 | — |
| 960 | i-$In_{0.3}Ga_{0.7}As$ | 7.5 | — |
| 958 | i-GaAs | 2 | — |
| 956 | i-$Al_{0.24}Ga_{0.76}As$ | 2 | — |
| 954 | n-$Al_{0.24}Ga_{0.76}As$ | 2 | x |
| 952 | i-$Al_{0.24}Ga_{0.76}As$ | 6 | — |

TABLE 10

| NO. | STRUCTURE | FILM THICKNESS (nm) | DOPING CONCENTRATION $\times 10^{18}$ (cm$^{-3}$) |
|---|---|---|---|
| 980 | $Al_2O_3$ | 12 | — |
| 972 | p-$In_{0.48}Ga_{0.52}P$ | 2 | 10 |
| 970 | o-$In_{0.48}Ga_{0.52}P$ | 8 | — |
| 966 | n-$Al_{0.24}Ga_{0.76}As$ | 2 | x |
| 964 | i-$Al_{0.24}Ga_{0.76}As$ | 2 | — |
| 962 | i-GaAs | 2 | — |
| 960 | i-$In_{0.3}Ga_{0.7}As$ | 7.5 | — |
| 958 | i-GaAs | 2 | — |
| 956 | i-$Al_{0.24}Ga_{0.76}As$ | 2 | — |
| 954 | n-$Al_{0.24}Ga_{0.76}As$ | 2 | x |
| 952 | i-$Al_{0.24}Ga_{0.76}As$ | 6 | — |

Here, simulation was conducted assuming that the InGaP layer has a natural superlattice. The InGaP layer generates a piezo charge by having a natural superlattice. This is a dipole moment. However, by forming a negative fixed space charge on the upper plane and a positive one on the lower plane of the InGaP layer, we can simulate the piezo charge. The plane density of the fixed space charge was set to $1 \times 10^{12}$ cm$^{-2}$. In reality, there will be a change such as in band gap, electron affinity, if the InGaP layer has a natural superlattice, which was not incorporated in this calculation.

Figure 26:
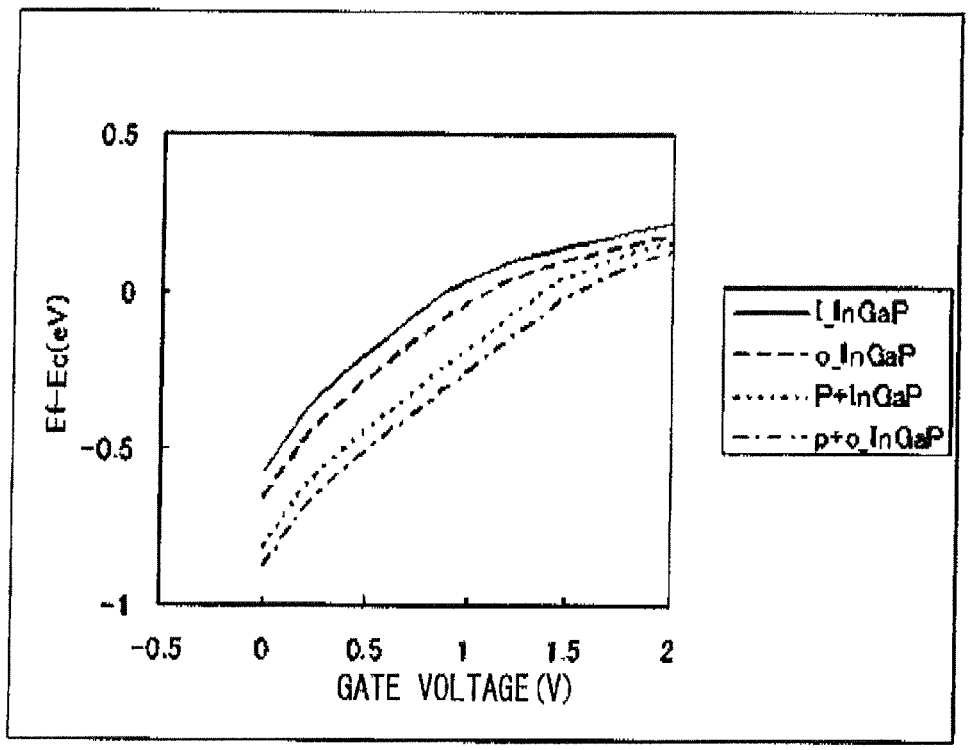
FIG. 26 shows a plot of the relation, with the gate voltage, of the calculated value of the Fermi level at the MOS interface of the semiconductor wafers 910, 920, 930, 940.

FIG. 26 shows a result of calculating the energy difference of the Fermi level at the MOS interface from the lower edge of the of the conduction band of the non-doped InGaP layer on the MOS interface, with respect to the gate voltage just as similar manner in FIG. 11. The calculation was based on the structure of each semiconductor wafer 910 to 940 of Table 7 through Table 10. Each condition for the calculation was set the same as in the case of FIG. 19. In the drawing, "i-InGaP" or "conventional structure" indicates the result using the semiconductor wafer 910 of Table 7, "o-InGaP" or "ordered InGaP" indicates the result using the semiconductor wafer 920 of Table 8, "P+InGaP" indicates the result using the semiconductor wafer 930 of Table 9, "p+o-InGaP", "ordered +P+InGaP" or "P+ordered-InGaP" indicates the result using the semiconductor wafer 940 of Table 10. The similar thing applies to FIG. 27 through FIG. 32. However, the alphabets or the symbols used in the legends in FIG. 27 through FIG. 32 do not distinguish between upper case letters, lower case letters, half size letters, full size letters. The symbols such as -, _(under bar), or the space are not distinguished either.

Figure 27:
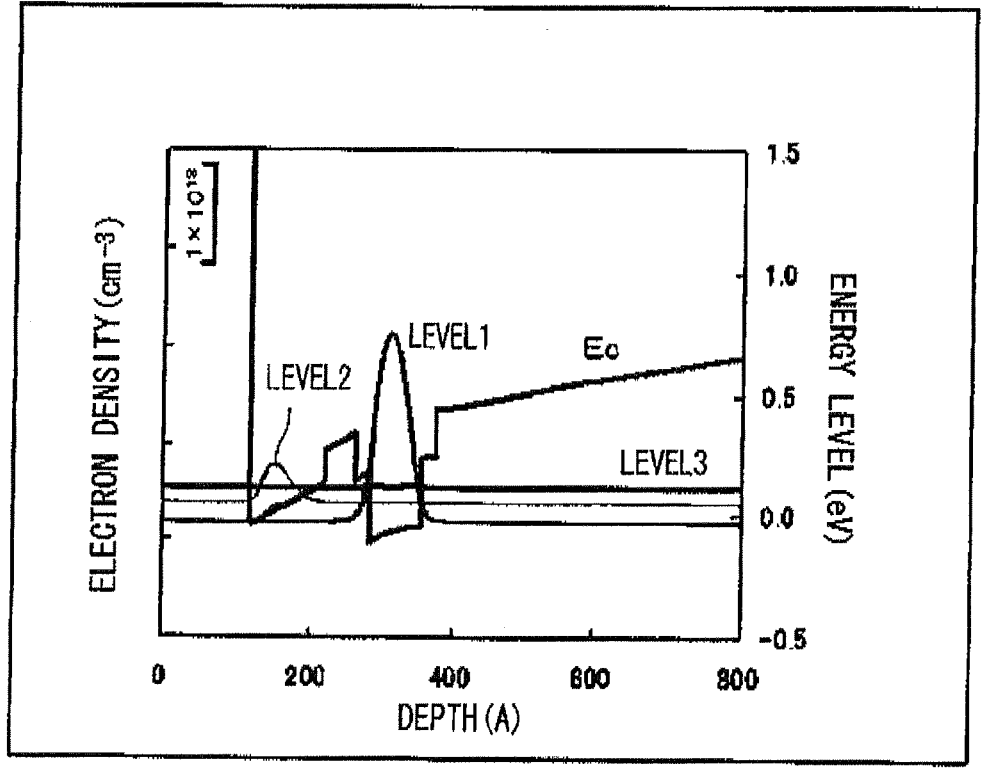
FIG. 27 shows a simulated depth profile of the electron density on the semiconductor wafer 910, with the gate voltage of 1.0 V.
Figure 28:
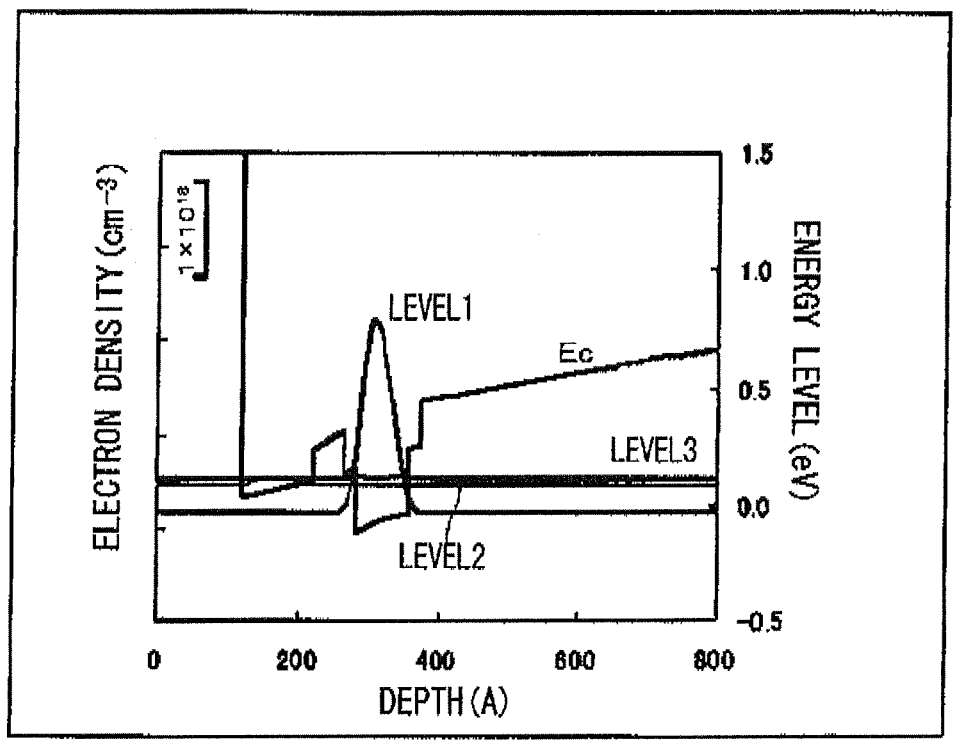
FIG. 28 shows a simulated depth profile of the electron density on the semiconductor wafer 920, with the gate voltage of 1.0 V.
Figure 29:
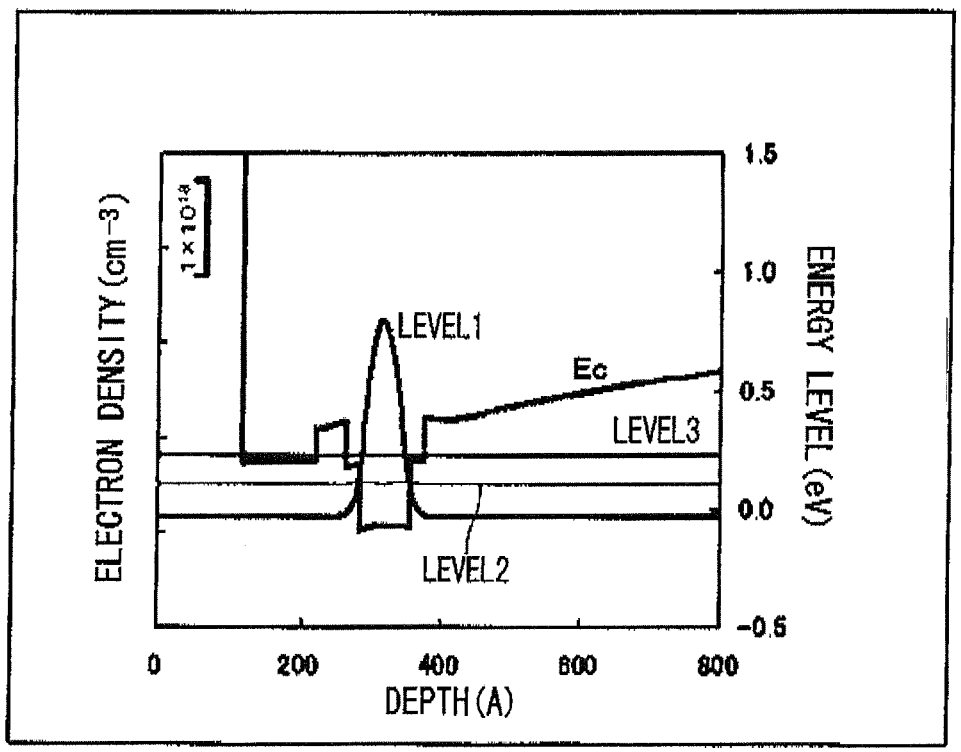
FIG. 29 shows a simulated depth profile of the electron density on the semiconductor wafer 930, with the gate voltage of 1.0 V.
Figure 30:
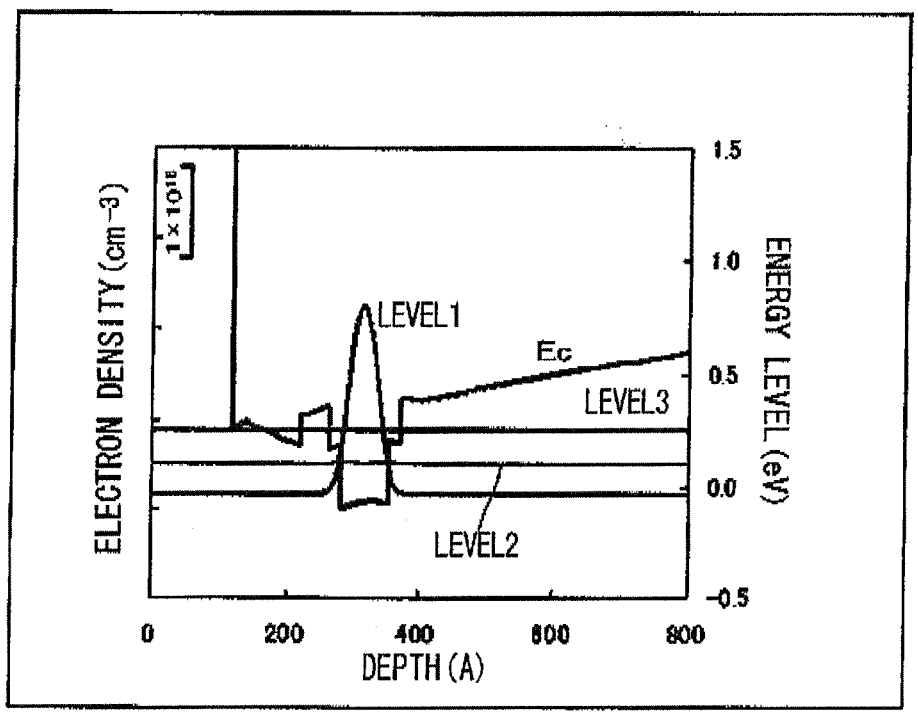
FIG. 30 shows a simulated depth profile of the electron density on the semiconductor wafer 940, with the gate voltage of 1.0 V.

FIG. 27 through FIG. 30 are a simulated depth profile of the electron density in the MOS structure, with Vg=1 V. FIG. 27 deals with the case of the MOS structure in the semiconductor wafer 910, FIG. 28 deals with the case of the MOS structure in the semiconductor wafer 920, FIG. 29 deals with the case of the MOS structure in the semiconductor wafer 930, FIG. 30 deals with the case of the MOS structure in the semiconductor wafer 940. Each of these drawings shows an electron density and a depth profile of the energy at the lower edge of the conduction band for three quantum level. These drawings show that the Fermi level at the MOS interface with reference to the lower edge of the conduction band of the InGaP layer is lowered due to ordering of the InGaP layer. The simulations in these drawings have similar results to the case of semiconductor wafer 600 in that the Fermi level was lowered at the MOS interface with reference to the lower edge of the conduction band of the InGaP layer as a result of doping accepter impurities into the InGaP layer. The results of the simulations also show that a further larger effect can be obtained by combining the ordering with the doping of the acceptor impurities.

Figure 31:
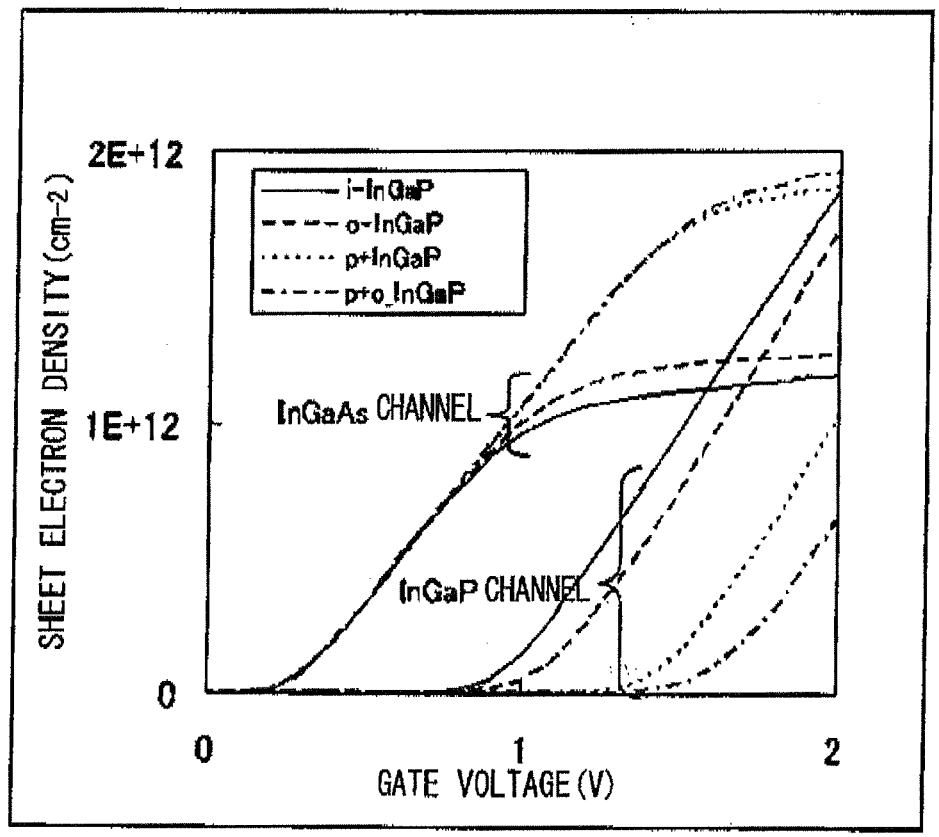
FIG. 31 shows a plot of the relation between the gate voltage and the calculated value of the sheet electron density of the channel of the MOS structure in the semiconductor wafers 910, 920, 930, 940.

FIG. 31 shows a result of calculating a gate bias dependency of the electron density for the "InGaAs channel" which is the first channel formed using the semiconductor wafer having the above-described MOS structure and the "InGaP channel" that is the second channel formed on the InGaP layer. The other specifics of the calculation were the same as in FIG. 19. This result shows that as a result of the ordering of the InGaP layer, the acceptor doping, or the combination of them, the gate voltage at which the "InGaP channel" which is the second channel occurs slits towards the positive side and the gate voltage at which the "InGaAs channel "saturates" shifts towards the positive side, and the "saturated" electron density gets higher.

Figure 32:
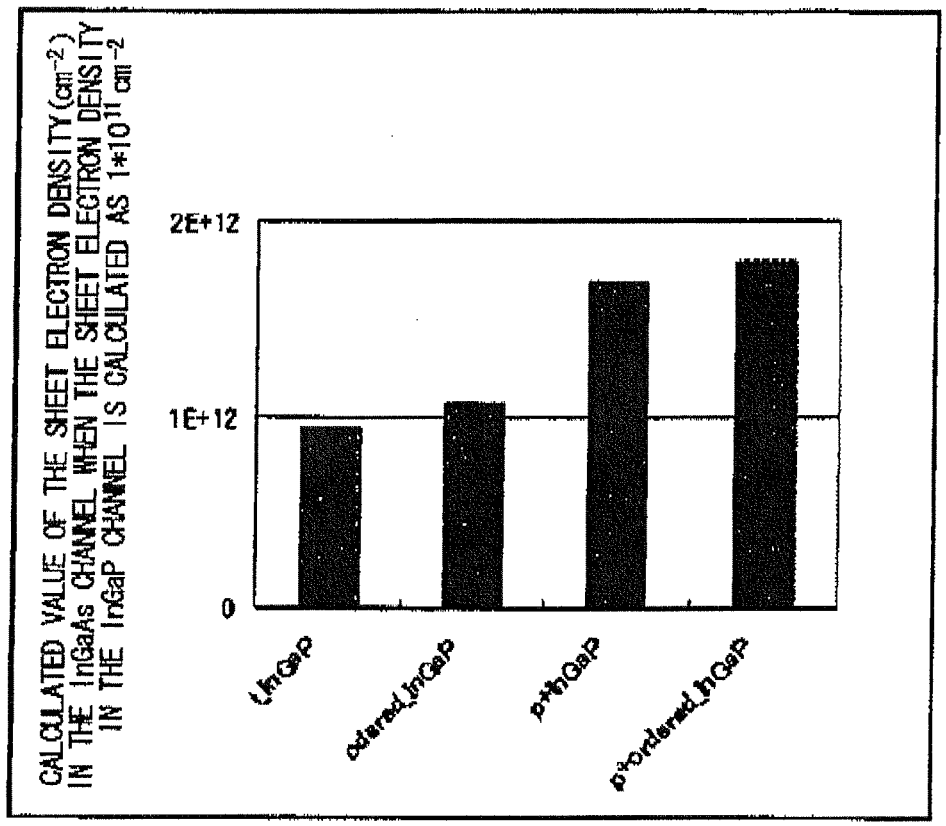
FIG. 32 shows a plot of the sheet electron density of the first channel's "InGaAs channel" when the sheet electron density of the second channel's "InGaP channel" of FIG. 31 is $1 \times 10^{11}$ cm$^{-2}$.

FIG. 32 shows the result of calculating the electron density or the "in GaAs channel" when the electron density of the "InGaP channel" is $1\times10^{11}$ cm$^{-2}$. As described before, this result also shows that making the semiconductor layer on the MOS interface of an InGaP layer is more effective in forming an insulated gate field effect transistor than using a GaAs layer, an AlGaAs layer. What is more, this embodiment example shows that a further suitable semiconductor wafer results by ordering of InGaP and doping or an acceptor impurity.

The embodiments have been explained. However, the present invention is not limited to the above-explained embodiments, and various changes can be made thereto. For example, the second crystalline layer 108 can be formed by doping an impurity atom during an epitaxial growth process, in which case, ion implementation or epitaxial regrowth can be used to form a source region and a drain region respectively connected to the source electrode 304 and the drain electrode 306. However, the second crystalline layer 108 is not necessarily formed on the entire plane of the semiconductor wafer.

Figure 33:
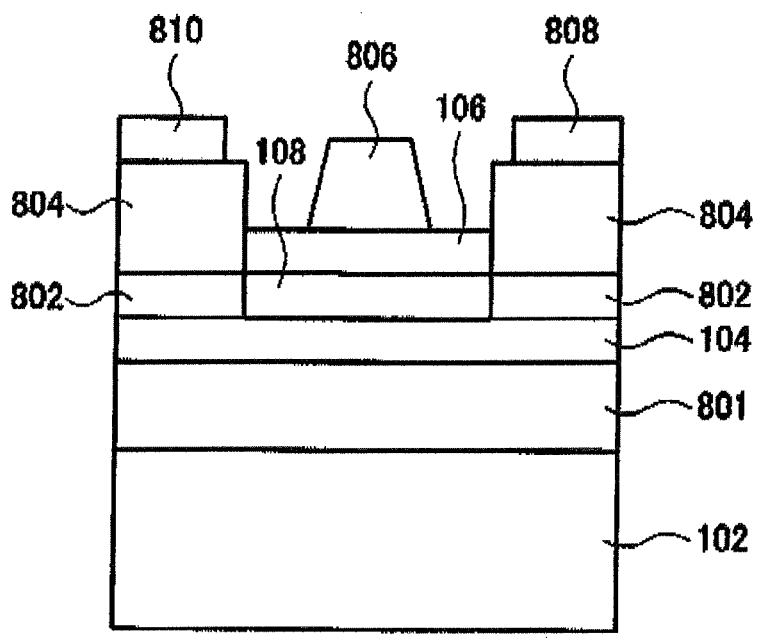
FIG. 33 shows a cross section of the insulated gate field effect transistor 800.

FIG. 33 shows a cross section of the insulated gate field effect transistor 800. The insulated gate field effect transistor 800 includes a base wafer 102, a fourth crystalline layer 801, a first crystalline layer 104, a second crystalline layer 108, an insulating layer 106, a semiconductor layer 802, a contact layer 804, a gate electrode 806, a source electrode 808, and a drain electrode 810. The base wafer 102 and the first crystalline layer 104 are the same as used in the semiconductor wafer 100. The insulating layer 106 is a gate insulating layer, and the second crystalline layer 108 is only formed under the gate electrode 806. Since there is no second crystalline layer 108 formed under the source electrode 808 or the drain electrode 810, the access resistance between the source electrode 808 and the drain electrode 810 with respect to the channel that underlies the gate electrode 806 can be lowered. This is useful for a case in which the insulated gate field effect transistor 800 is operated in an enhancement mode. If the second crystalline layer 108 is formed in a region that underlies the gate electrode 806 as well as being equal to or narrower than the gate electrode region, the region in which the second crystalline layer 108 exists will function as an intrinsic channel region of a transistor, which enables to set high the carrier concentration for the area between the source or drain electrode and the gate electrode and in the area of the gate electrode where there is no second crystalline layer. This enables further lowering the resistance of these areas, to lead to further lowering of the access resistance between the source and drain electrode and the intrinsic channel region of the transistor. Note that it is preferable to form a buffer layer between the base wafer 102 and the fourth crystalline layer 801.

When the insulated gate field effect transistor 800 is of an N-channel-type, preferable impurity atom to be doped into the second crystalline layer 108 is Zn. Zn can be introduced by ion implantation or thermal diffusion, and so is suited for a structure in which the second semiconductor layer 108 is only formed under the gate.

Figure 34:
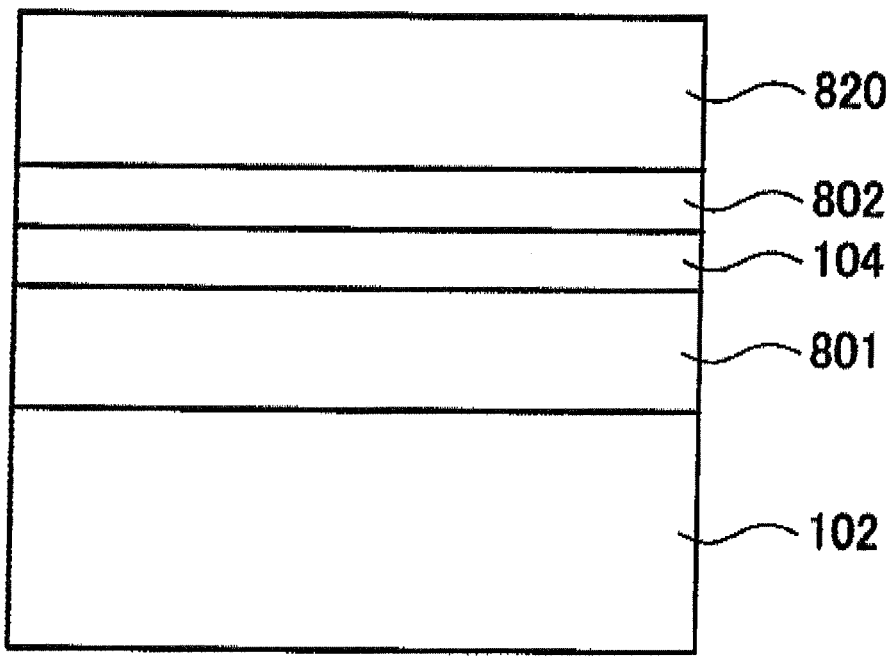
FIG. 34 shows a schematic view or an exemplary insulated gate field effect transistor 800 during a production process.
Figure 35:
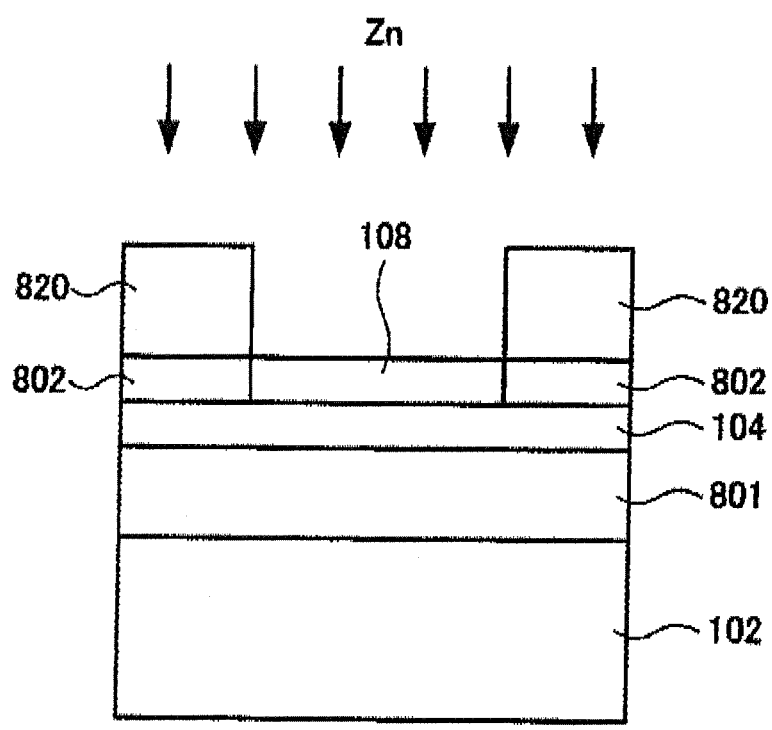
FIG. 35 shows a schematic view of an exemplary insulated gate field effect transistor 800 during a production process.
Figure 36:
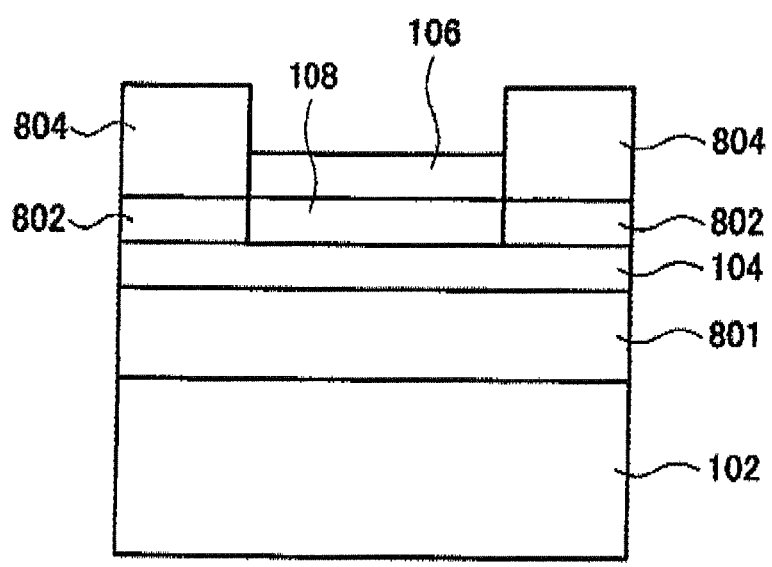
FIG. 36 shows a schematic view of an exemplary insulated gate field effect transistor 800 during a production process.

FIG. 34 through FIG. 36 show a schematic view of an exemplary insulated gate field effect transistor 800 during a production process. As shown in FIG. 34, the fourth crystalline layer 801, the first crystalline layer 104, and the semiconductor layer 802 are sequentially formed by epitaxial growth on the base wafer 102. A buffer layer may be formed between the base wafer 102 and the fourth crystalline layer 801. The semiconductor layer 802 is a crystalline layer to be the second crystalline layer 108 when doped with an impurity. Furthermore, a mask layer 820 is formed on the semiconductor layer 802.

As shown in FIG. 35, the mask layer 820 was processed, to form an aperture in a region to be provided with a gate electrode 806. Then, the mask layer 820 is used as a mask to conduct ion implantation of Zn into the semiconductor layer 802 inside the aperture. Note that instead of ion implantation of Zn, a gas phase process may be used to dope Zn by thermal diffusion into the semiconductor layer 802 inside the aperture. The region of the semiconductor layer 802 doped with Zn will be the second crystalline layer 108.

As FIG. 36 shows, the mask layer 820 is removed, to form the contact layer 804 and the insulating layer 106. Thereafter, the gate electrode 806, the source electrode 808, and the drain electrode 810 are formed, thereby fabricating the insulated gate field effect transistor 800.

The invention claimed is:
1. A semiconductor wafer comprising:
a base wafer, a first crystalline layer, a second crystalline layer, and an insulating layer that are positioned in the stated order, the semiconductor wafer further comprising:
a third crystalline layer positioned either between the first crystalline layer and the second crystalline layer or between the base wafer and the first crystalline layer, wherein
the second crystalline layer is made of a crystal that either lattice matches or pseudo lattice matches a crystal making the first crystalline layer, and has a wider band gap than the crystal making the first crystalline layer,
the third crystalline layer is made of a crystal that either lattice matches or pseudo lattice matches the crystal making the first crystalline layer, and has a wider band gap than the crystal making the first crystalline layer,
the third crystalline layer includes a first atom that will be a donor or an acceptor, and
when the third crystalline layer includes a first atom that will be a donor, the second crystalline layer includes a second atom that will be an acceptor, and
when the third crystalline layer includes a first atom that will be an acceptor, the second crystalline layer includes a second atom that will be a donor.

2. The semiconductor wafer according to claim 1, wherein the first crystalline layer can be applied to a channel layer of a field effect transistor,
the insulating layer can be applied to a gate insulating layer of the field effect transistor,
when the field effect transistor is of an N-channel-type, the first atom of the third crystalline layer will be a donor, and
when the field effect transistor is a P-channel-type, the first atom of the third crystalline layer will be an acceptor.

3. The semiconductor wafer according to claim 2, wherein the sheet concentration $N_1$ of the first atom and the sheet concentration $N_2$ of the second atom satisfy the relation of the following Expression 1:

$$N_{0min} + SF_{min} \times N_2 < N_1 < N_{0max} + SF_{max} \times N_2 \quad \text{EXPRESSION 1}$$

where $N_{0min}$ and $N_{0max}$ are respectively the minimum value and the maximum value of the sheet concentration $N_0$ of the first atom where the threshold voltage of the field effect transistor becomes a design value when no second atom is doped into the second crystalline layer, and $SF_{min}$ and $SF_{max}$ are respectively the minimum value and the maximum value of the structural factor SF showing the layer structure of the field effect transistor.

4. The semiconductor wafer according to claim 2, wherein the first crystalline layer is made of a crystal represented by $In_xGa_{1-x}As$ ($0 \leq x \leq 1$), and
the second crystalline layer is made of a crystal represented by $In_xAl_mGa_{1-k-m}As_nP_{1-n}$ ($0 \leq k \leq 1$, $0 \leq m \leq 1$, $0 \leq k+m \leq 1$, $0 \leq n \leq 1$).

5. The semiconductor wafer according to claim 4, wherein the base wafer is either a GaAs or InP wafer.

6. The semiconductor wafer according to claim 4, wherein the first crystalline layer is made of a crystal represented by $In_xGa_{1-x}As$ ($0 \leq x \leq 1$) that can either lattice match or pseudo lattice match GaAs, and
the second crystalline layer is made of a crystal represented by $Al_mGa_{1-m}As$ ($0 \leq m \leq 1$).

7. The semiconductor wafer according to claim 6, wherein the base wafer is a GaAs wafer.

8. The semiconductor wafer according to claim 4, wherein the first crystalline layer is made of a crystal represented by $In_xGa_{1-x}As$ ($0 \leq x \leq 1$) that can either lattice match or pseudo lattice match GaAs, and
the second crystalline layer is made of a crystal represented by $In_kAl_mGa_{1-k-m}$ ($0 \leq k \leq 1$, $0 \leq m \leq 1$, $0 \leq k+m \leq 1$).

9. The semiconductor wafer according to claim 8, wherein the field effect transistor is of an N-channel-type, and
the second crystalline layer is made of a crystal represented by $In_kAl_mGa_{1-k-m}P$ ($0 \leq k \leq 1$, $0 \leq m \leq 1$, $0 \leq k+m \leq 1$) that has a natural superlattice.

10. The semiconductor wafer according to claim 8, wherein
the second crystalline layer is made of a crystal represented by $In_kGa_{1-k}P$ ($0 \leq k \leq 1$).

11. The semiconductor wafer according to claim 2, wherein
the field effect transistor is of an N-channel-type, and
the second atom is either a C atom or a Zn atom.

12. The semiconductor wafer according to claim 1, further comprising:
a fourth crystalline layer, wherein

TABLE 9

| NO. | STRUCTURE | FILM THICKNESS (nm) | DOPING CONCENTRATION $\times 10^{18}$ (cm$^{-3}$) |
|---|---|---|---|
| 980 | $Al_2O_3$ | 12 | — |
| 972 | p-$In_{0.48}Ga_{0.52}P$ | 2 | 10 |
| 968 | i-$In_{0.48}Ga_{0.52}P$ | 8 | — |
| 966 | n-$Al_{0.24}Ga_{0.76}As$ | 2 | x |
| 964 | i-$Al_{0.24}Ga_{0.76}As$ | 2 | — |
| 962 | i-GaAs | 2 | — |
| 960 | i-$In_{0.3}Ga_{0.7}As$ | 7.5 | — |
| 958 | i-GaAs | 2 | — |
| 956 | i-$Al_{0.24}Ga_{0.76}As$ | 2 | — |
| 954 | n-$Al_{0.24}Ga_{0.76}As$ | 2 | x |
| 952 | i-$Al_{0.24}Ga_{0.76}As$ | 6 | — | when the third crystalline layer is disposed between the first crystalline layer and the second crystalline layer, the fourth crystalline layer is disposed between the base wafer and the first crystalline layer,
when the third crystalline layer is disposed between the base wafer and the first crystalline layer, the fourth crystalline layer is disposed between the first crystalline layer and the second crystalline layer,
the fourth crystalline layer is made of a crystal that either lattice matches or pseudo lattice matches the crystal making the first crystalline layer, and has a wider band gap than the crystal making the first crystalline layer, and
the fourth crystalline layer includes the first atom.

13. The semiconductor wafer according to claim 1, wherein
when the sheet concentration of the second atom is $N_2$, $N_2$ satisfies the relation of Expression 2:

$$N_2 < 1 \times 10^{12} \, (\text{cm}^{-2}) \quad \text{EXPRESSION 2.}$$

14. The semiconductor wafer according to claim 1, wherein
when the effective electric film thickness is $(d/\epsilon)_E$ as defined by Expression 3, and the sheet concentration of the second atom is $N_2$, the relation of Expression 4 is satisfied:

$$\left(\frac{d}{\epsilon}\right)_E = \frac{\left(\frac{d}{\epsilon}\right)_1 \times \left(\frac{d}{\epsilon}\right)_3}{\left(\frac{d}{\epsilon}\right)_1 + \left(\frac{d}{\epsilon}\right)_2 + \left(\frac{d}{\epsilon}\right)_3} \quad \text{EXPRESSION 3}$$

$$N_2 \times (d/\epsilon)_E > 1 \times 10^5 \, (\text{cm}^{-1}) \quad \text{EXPRESSION 4}$$

where $(d/\in)_1$ shows an electric film thickness [cm] of the insulating layer, $(d/\in)_2$ shows an electric filth thickness [cm] between the interface of the insulating layer that is near the second crystalline layer and a doping center position of the second atom in the second crystalline layer, and $(d/\in)_3$ is an electric film thickness [cm] between the doping center position of the second atom in the second crystalline layer and a center position of the first crystalline layer, and the electric film thickness is a value obtained by dividing the actual film thickness d [cm] of the layer by a relative permittivity $\in$[no unit].

15. The semiconductor wafer according to claim 1, wherein
the first crystalline layer is made of a crystal represented by $In_yGa_{1-y}N$ ($0 \leq y \leq 1$) that can either lattice match or pseudo lattice match GaN, and
the second crystalline layer is made of a crystal represented by $In_pAl_qGa_{1-p-q}N$ ($0 \leq p \leq 1$, $0 \leq q \leq 1$, $0 \leq p+q \leq 1$).

16. The semiconductor wafer according to claim 15, wherein
the base wafer is a GaN wafer.

17. The semiconductor wafer according to claim 1, wherein
the insulating layer is formed to be in contact with the second crystalline layer.

18. The semiconductor wafer according to claim 17, wherein
all or a part of the region of the insulating layer, which region is in contact with the second crystalline layer, includes aluminum oxide.

19. An insulated gate field effect transistor comprising:
a semiconductor wafer according to claim 1;
the first crystalline layer in the semiconductor wafer as a channel layer;
the insulating layer or the semiconductor wafer as a gate insulating layer; and
a gate electrode formed directly or indirectly on the gate insulating layer.

20. The insulated gate field effect transistor according to claim 19, wherein
the second crystalline layer is only formed below the gate electrode, or
a region of the second crystalline layer that includes the second atom is only formed below the gate electrode.

21. A method for producing a semiconductor wafer according to claim 1, comprising:
forming the first crystalline layer directly or indirectly on the base wafer by epitaxial growth;
forming the second crystalline layer directly or indirectly on the first crystalline layer by epitaxial growth;
doping the second crystalline layer with the second atom; and
forming the insulating layer directly or indirectly on the second crystalline layer.

22. The method according to claim 21 for producing the semiconductor wafer, wherein
the second atom is Zn, and
the second crystalline layer is doped with Zn by thermal diffusion.

* * * * *